(12) United States Patent
Lee

(10) Patent No.: US 11,569,333 B2
(45) Date of Patent: Jan. 31, 2023

(54) DISPLAY APPARATUS WITH PIXEL ELECTRODE HAVING STEP TOP SURFACE WITHIN CONTACT HOLE

(71) Applicant: SAMSUNG DISPLAY CO., LTD., Yongin-si (KR)

(72) Inventor: Hyeonbum Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 198 days.

(21) Appl. No.: 17/001,907

(22) Filed: Aug. 25, 2020

(65) Prior Publication Data
US 2021/0225987 A1    Jul. 22, 2021

(30) Foreign Application Priority Data

Jan. 16, 2020    (KR) .................. 10-2020-0006020

(51) Int. Cl.
*H01L 27/32*    (2006.01)
(52) U.S. Cl.
CPC ...... *H01L 27/3276* (2013.01); *H01L 27/3246* (2013.01)
(58) Field of Classification Search
CPC .................. H01L 27/3276; H01L 27/3246
See application file for complete search history.

(56) References Cited

U.S. PATENT DOCUMENTS

| 6,778,232 B2 * | 8/2004 | Nakata | H01L 27/1244 |
| | | | 257/E27.111 |
| RE39,452 E * | 1/2007 | Fujikawa | H01L 29/458 |
| | | | 349/139 |
| 7,190,000 B2 * | 3/2007 | Ryu | H01L 27/1248 |
| | | | 257/E27.111 |
| 8,921,861 B2 | 12/2014 | Chae et al. | |
| 10,067,393 B2 | 9/2018 | Ryu et al. | |
| 10,437,109 B2 | 10/2019 | Kim et al. | |

(Continued)

FOREIGN PATENT DOCUMENTS

| KR | 10-0738583 | 7/2007 |
| KR | 10-0762686 | 9/2007 |

(Continued)

*Primary Examiner* — Lex H Malsawma
(74) *Attorney, Agent, or Firm* — F. Chau & Associates, LLC

(57) ABSTRACT

A display apparatus including: a first thin-film transistor and a second thin-film transistor on a substrate, wherein the first thin-film transistor includes a first electrode layer, and the second thin-film transistor includes a second electrode layer; an insulating layer having a first contact hole and a second contact hole respectively exposing the first electrode layer and the second electrode layer; a first pixel electrode connected to the first thin-film transistor through the first contact hole; and a second pixel electrode connected to the second thin-film transistor through the second contact hole. A top surface of the first pixel electrode overlapping the first electrode layer in the first contact hole has a first step facing a first direction, and a top surface of the second pixel electrode overlapping the second electrode layer in the second contact hole has a second step facing a second direction opposite to the first direction.

20 Claims, 18 Drawing Sheets

(56) References Cited

U.S. PATENT DOCUMENTS

| | | | | |
|---|---|---|---|---|
| 2005/0092999 A1* | 5/2005 | Fujikawa | ............... | H01L 29/458 |
| | | | | 257/E29.147 |
| 2005/0110019 A1* | 5/2005 | Ryu | .................. | G02F 1/136227 |
| | | | | 257/E27.111 |
| 2014/0353620 A1* | 12/2014 | Park | .................... | H01L 51/5253 |
| | | | | 438/34 |

FOREIGN PATENT DOCUMENTS

| KR | 10-2016-0073691 | 6/2016 |
|---|---|---|
| KR | 10-2017-0084385 | 7/2017 |
| KR | 10-2029389 | 9/2019 |

* cited by examiner

DISPLAY APPARATUS WITH PIXEL ELECTRODE HAVING STEP TOP SURFACE WITHIN CONTACT HOLE

CROSS-REFERENCE TO RELATED APPLICATION

This application claims priority under 35 U.S.C. § 119 to Korean Patent Application No. 10-2020-0006020, filed on Jan. 16, 2020, in the Korean Intellectual Property Office, the disclosure of which is incorporated by reference herein in its entirety.

TECHNICAL FIELD

One or more exemplary embodiments of the present invention relate to a display apparatus, and more particularly, to a display apparatus with improved color separation of reflected light.

DISCUSSION OF THE RELATED ART

A display apparatus visually displays data. A display apparatus may be used as a display unit of a small-sized product such as a mobile phone or a large-sized product such as a television.

Generally, a display apparatus includes a plurality of pixels receiving electrical signals to emit light to display an image. Each pixel includes a light-emitting element. For example, an organic light-emitting display apparatus includes an organic light-emitting diode (OLED) as a light-emitting element. Generally, an organic light-emitting display apparatus includes a thin-film transistor and an OLED disposed on a substrate, and the OLED emits light by itself.

As use of display apparatuses has become diversified, various configurations for the display apparatuses have been under development to increase display quality of the display apparatuses.

SUMMARY

According to an exemplary embodiment of the present invention, a display apparatus including: a first thin-film transistor and a second thin-film transistor each arranged on a substrate, wherein the first thin-film transistor includes a first electrode layer, and the second thin-film transistor includes a second electrode layer; an insulating layer having a first contact hole and a second contact hole respectively exposing a portion of the first electrode layer and a portion of the second electrode layer; a first pixel electrode arranged on the insulating layer and connected to the first thin-film transistor through the first contact hole; and a second pixel electrode arranged on the insulating layer and connected to the second thin-film transistor through the second contact hole, wherein a top surface of the first pixel electrode overlapping the first electrode layer in the first contact hole has a first step facing a first direction, and a top surface of the second pixel electrode overlapping the second electrode layer in the second contact hole has a second step facing a second direction opposite to the first direction.

In an exemplary embodiment of the present invention, the display apparatus further includes a step correction layer arranged between the substrate and the insulating layer and at least partially overlapping the first contact hole.

In an exemplary embodiment of the present invention, the display apparatus further includes a conductive line arranged between the substrate and the step correction layer, and extends in a third direction crossing the first direction and the second direction, and wherein the conductive line overlaps a portion of the first contact hole and a portion of the second contact hole.

In an exemplary embodiment of the present invention, a top surface of a portion of the first pixel electrode overlapping the conductive line is lower than a top surface of a portion of the first pixel electrode overlapping the step correction layer.

In an exemplary embodiment of the present invention, the conductive line overlaps the step correction layer.

In an exemplary embodiment of the present invention, the conductive line is an emission control line.

In an exemplary embodiment of the present invention, the conductive line is disconnected at the first contact hole.

In an exemplary embodiment of the present invention, the display apparatus further includes a gate insulating layer arranged between the step correction layer and the conductive line, and having a third contact hole and a fourth contact hole each exposing a portion of the conductive line, and wherein the step correction layer is connected to the conductive line through the third contact hole and the fourth contact hole.

In an exemplary embodiment of the present invention, the first pixel electrode extends in the first direction, and the second pixel electrode extends in the second direction.

In an exemplary embodiment of the present invention, the display apparatus further includes a pixel defining film having a first opening and a second opening, wherein the first opening forms a first emission area of the first pixel electrode, and the second opening forms a second emission area of the second pixel electrode, and wherein the first opening is located on the first direction side with respect to the first contact hole, and the second opening is located on the second direction side with respect to the second contact hole.

In an exemplary embodiment of the present invention, the first step has a first inclined surface facing the first direction, and the second step has a second inclined surface facing the second direction.

In an exemplary embodiment of the present invention, the display apparatus further including: a first intermediate layer and a second intermediate layer respectively arranged on the first pixel electrode and the second pixel electrode, and an opposite electrode covering the first intermediate layer and the second intermediate layer, wherein, when the first intermediate layer emits green light, the second intermediate layer emits red or blue light, and when the first intermediate layer emits red or blue light, the second intermediate layer emits green light.

In an exemplary embodiment of the present invention, the first thin-film transistor includes a semiconductor layer and a gate electrode overlapping the semiconductor layer, wherein the display apparatus further includes an upper electrode of a storage capacitor arranged on the gate electrode and overlapping the gate electrode, and wherein the step correction layer is arranged on a same layer as the upper electrode.

In an exemplary embodiment of the present invention, the first thin-film transistor overlaps the storage capacitor, and the gate electrode corresponds to a lower electrode of the storage capacitor.

In an exemplary embodiment of the present invention, the first thin-film transistor further includes a third electrode layer arranged between the substrate and the first electrode layer, and wherein the step correction layer is arranged on a same layer as the third electrode layer.

In an exemplary embodiment of the present invention, the first thin-film transistor includes a semiconductor layer and a gate electrode overlapping the semiconductor layer, and the third electrode layer connects the semiconductor layer to the first electrode layer.

In an exemplary embodiment of the present invention, the step correction layer is separated from the first thin-film transistor.

In an exemplary embodiment of the present invention, the first pixel electrode extends in the second direction, and the second pixel electrode extends in the first direction.

In an exemplary embodiment of the present invention, the display apparatus further includes a pixel defining film having a first opening and a second opening, wherein the first opening forms a first emission area of the first pixel electrode, and the second opening forms a second emission area of the second pixel electrode, wherein the first opening is located on the second direction side with respect to the first contact hole, the second opening is located on the first direction side with respect to the second contact hole, and wherein the first step has a first inclined surface inclined toward the first direction, and the second step has a second inclined surface inclined toward the second direction.

In an exemplary embodiment of the present invention, the display apparatus further includes: a first intermediate layer and a second intermediate layer respectively arranged on the first pixel electrode and the second pixel electrode, and an opposite electrode covering the first intermediate layer and the second intermediate layer, wherein, when the first intermediate layer emits red or blue light, the second intermediate layer emits green light, and when the first intermediate layer emits green light, the second intermediate layer emits red or blue light.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
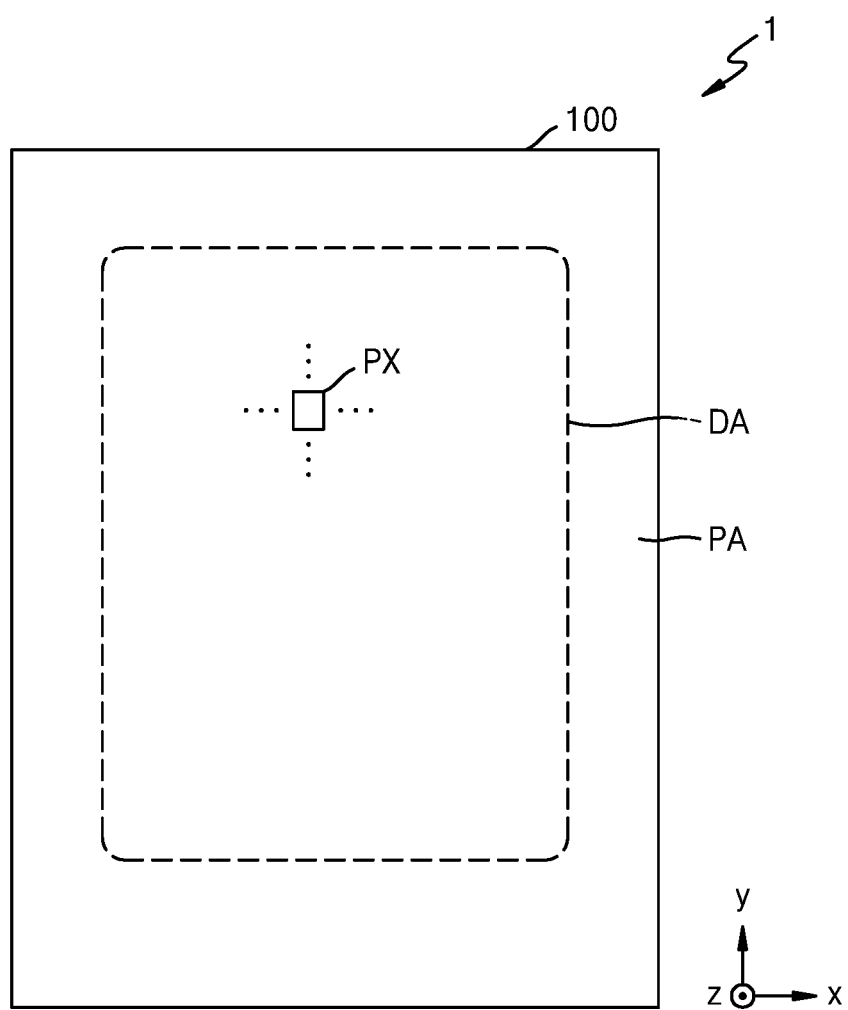
FIG. 1 is a schematic plan view of a display apparatus according to an exemplary embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein. It is to be understood that like reference numerals may refer to like elements throughout the specification, and thus redundant descriptions may be omitted. As used herein, the term "and/or" includes any and all combinations of one or more of the associated listed items.

It will be understood that while such terms as "first," "second," etc., may be used to describe various elements, such elements should not be limited to by these terms. These terms are only used to distinguish one element from another. Thus, a first component discussed below could be termed a second component without departing from the spirit and scope of the present invention.

It is to be understood that an expression used in the singular encompasses the expression of the plural, unless the context clearly indicates otherwise.

Sizes of components in the drawings may be exaggerated for clarity. In other words, since sizes and thicknesses of components in the drawings may be exaggerated for clarity, the present invention is not limited thereto.

When an exemplary embodiment of the present invention may be implemented differently, a process order may be performed differently from the described order. For example, two consecutively described processes may be performed substantially at the same time or performed in an order opposite to the described order.

In the disclosure, "A and/or B" may include "A", "B", or "A and B". In addition, "at least one of A and B" may include "A", "B", or "A and B".

It will be understood that when a layer, region, or component is referred to as being connected to another layer, region, or component, it can be directly or indirectly connected to the other layer, region, or component.

It is to be understood that the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, one or more exemplary embodiments of the present invention will be described in detail with reference to accompanying drawings.

FIG. 1 is a schematic plan view of a display apparatus 1 according to an exemplary embodiment of the present invention.

Referring to FIG. 1, the display apparatus 1 includes a display area DA displaying an image and a peripheral area PA around the display area DA. The display apparatus 1 may provide an image to the outside by using light emitted from the display area DA.

A substrate 100 may include various materials such as glass, metal, plastic, or the like. According to an exemplary embodiment of the present invention, the substrate 100 may include a flexible material. For example, the substrate including the flexible material may be crooked, bent, folded, or rolled. The substrate 100 including the flexible material may include ultra-thin glass, metal, and/or plastic.

Pixels PX including various display elements, such as an organic light-emitting diode (OLED), may be arranged in the display area DA of the substrate 100. A plurality of pixels PX may be included in the display apparatus, and the plurality of pixels PX may be arranged in various forms such as a stripe arrangement, a pentile arrangement, a mosaic arrangement, or the like to implement an image.

In a plan view of the display area DA, the display area DA may have a rectangular shape, as shown in FIG. 1. In an exemplary embodiment of the present invention, the display area DA may have a polygonal shape such as a triangular shape, a pentagonal shape, a hexagonal shape, or the like, or a circular shape, an elliptical shape, an atypical shape, or the like.

The peripheral area PA of the substrate 100 is an area around the display area DA, and may be an area where no image is displayed. For example, the peripheral area PA may at least partially surround the display area DA. Various lines configured to deliver an electrical signal to the display area DA and pads, to which a printed circuit board or a driver integrated circuit (IC) chip is attached, may be located in the peripheral area PA.

Figure 2:
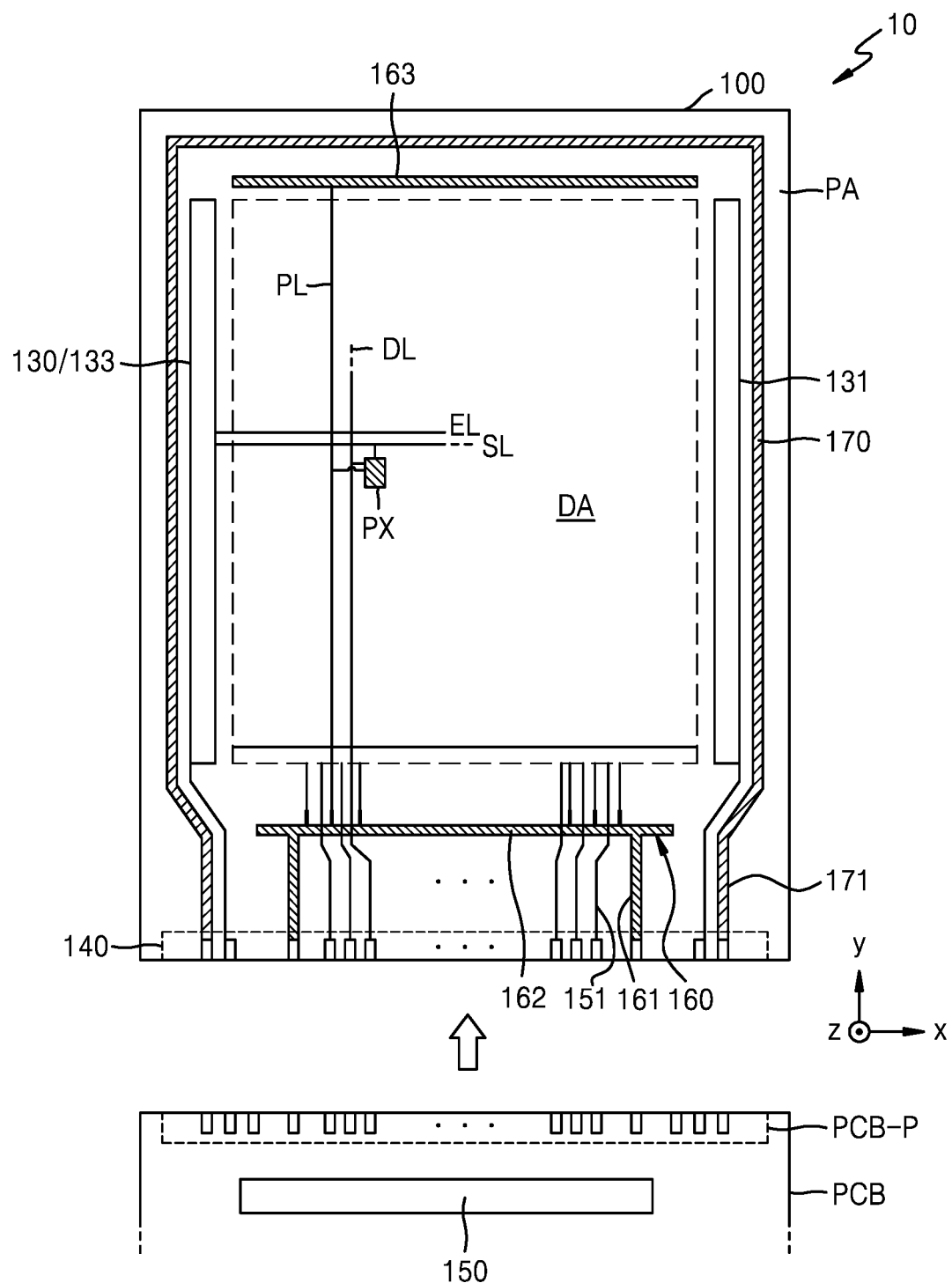
FIG. 2 is a schematic plan view of a display panel according to an exemplary embodiment of the present invention.

FIG. 2 is a schematic plan view of a display panel 10 according to an exemplary embodiment of the present invention.

Referring to FIG. 2, the display panel 10 includes the display area DA and the peripheral area PA, and includes the plurality of pixels PX arranged in the display area DA. Each of the plurality of pixels PX may include a display element such as OLED. Each pixel PX may emit, for example, red, green, blue, or white light through the OLED. Hereinafter, each pixel PX may be referred to as a sub-pixel emitting a different color, and each pixel PX may include, for example, one of a red R sub-pixel, a green G sub-pixel, and a blue B sub-pixel. For example, a pixel unit may include one of a red R sub-pixel, a green G sub-pixel, and a blue B sub-pixel. The display area DA may be covered by an encapsulation member to be protected from external air or moisture.

Each pixel PX may be electrically connected to outer circuits arranged in the peripheral area PA. A first scan driving circuit 130, a second scan driving circuit 131, an emission driving circuit 133, a terminal 140, a data driving circuit 150, a first power supply line 160, and a second power supply line 170 may be arranged in the peripheral area PA.

The first scan driving circuit 130 and the second scan driving circuit 131 may provide scan signals to each pixel PX through a scan line SL. The second scan driving circuit 131 may be arranged in parallel with the first scan driving circuit 130 with the display area DA between the second scan driving circuit 131 and the first scan driving circuit 130. Some of the pixels PX arranged in the display area DA may be electrically connected to the first scan driving circuit 130, and the remaining pixels PX may be connected to the second scan driving circuit 131. In an exemplary embodiment of the present invention, the second scan driving circuit 131 may be omitted.

The emission driving circuit 133 may provide an emission control signal to each pixel PX through an emission control line EL.

The terminal 140 may be arranged on one side of the substrate 100. The terminal 140 may be exposed by not being covered by an insulating layer and may be electrically connected to a printed circuit board PCB. A terminal PCB-P of the printed circuit board PCB may be electrically connected to the terminal 140 of the display panel 10. The printed circuit board PCB transmits a signal or power from a controller to the display panel 10.

Control signals generated by the controller may be respectively transmitted to the first and second scan driving circuits 130 and 131 through the printed circuit board PCB. The controller may respectively provide first and second power supply voltages to the first and second power supply lines 160 and 170 through first and second connection lines 161 and 171. For example, the first power voltage may be a driving voltage (ELVDD in FIG. 3 to be described below) and the second power voltage may be a common voltage (ELVSS in FIG. 3 to be described below). The first power supply voltage may be provided to each pixel PX through a driving voltage line PL connected to the first power supply line 160, and the second power supply voltage may be provided to an opposite electrode (230 in FIG. 6A to be described below) of each pixel PX connected to the second power supply line 170.

The data driving circuit 150 is electrically connected to a data line DL. A data signal of the data driving circuit 150 may be provided to each pixel PX through a connection line 151, which is connected to the terminal 140, and the data line DL, which is connected to the connection line 151. Although FIG. 2 illustrates that the data driving circuit 150 is arranged in the printed circuit board PCB, the data driving circuit 150 may be arranged on the substrate 100 in an exemplary embodiment of the present invention. For example, the data driving circuit 150 may be arranged between the terminal 140 and the first power supply line 160.

The first power supply line 160 may include a first sub-line 162 and a second sub-line 163 both extending in parallel to each other along an x-direction with the display area DA between the first sub-line 162 and the second sub-line 163. The second power supply line 170 may partially surround the display area DA in a loop shape with one side open.

Figure 3:
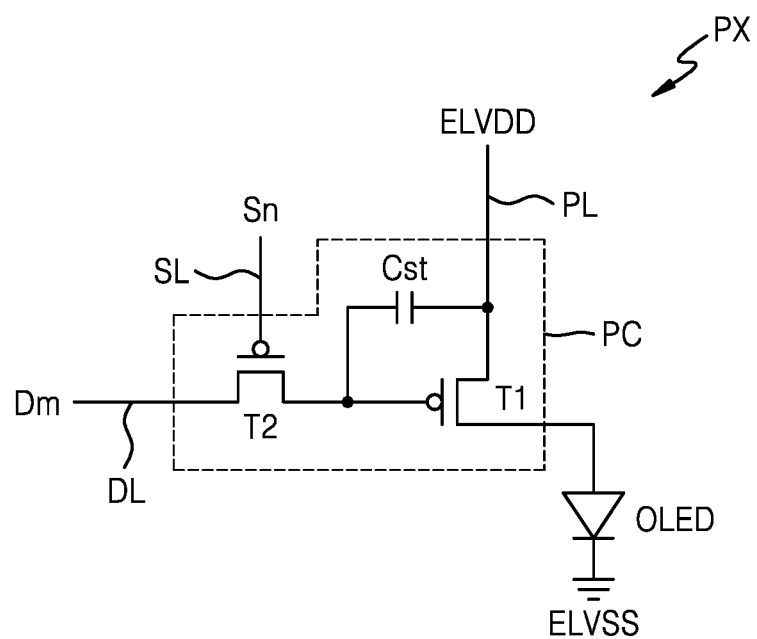
FIG. 3 is a circuit diagram of a pixel included in a display apparatus according to an exemplary embodiment of the present invention.

FIG. 3 is a circuit diagram of the pixel PX included in a display apparatus according to an exemplary embodiment of the present invention.

Referring to FIG. 3, each pixel PX includes a pixel circuit PC connected to the scan line SL, the data line DL and an organic light-emitting diode OLED.

The pixel circuit PC includes a driving thin-film transistor (TFT) T1, a switching TFT T2, and a storage capacitor Cst. The switching TFT T2 is connected to the scan line SL and the dataline DL, and is configured to transmit a data signal Dm to the driving TFT T1 through the data line DL according to a scan signal Sn input through the scan line SL.

The storage capacitor Cst is connected to the switching TFT T2 and the driving voltage line PL, and stores a voltage corresponding to a difference between a voltage received from the switching TFT T2 and the driving voltage ELVDD supplied to the driving voltage line PL.

The driving TFT T1 may be connected to the driving voltage line PL and the storage capacitor Cst, and may control a driving current flowing from the driving voltage line PL to the organic light-emitting diode OLED in accordance with a voltage value stored in the storage capacitor Cst. The organic light-emitting diode OLED may emit light having a predetermined brightness according to the driving current.

Although FIG. 3 illustrates that the pixel circuit PC includes two TFTs and one storage capacitor, the present invention is not limited to thereto. For example, the pixel circuit PC may include three or more TFTs and/or two or more storage capacitors. In an exemplary embodiment of the present invention, the pixel circuit PC may include seven TFTs and one storage capacitor. The embodiment will now be described in FIG. 4.

Figure 4:
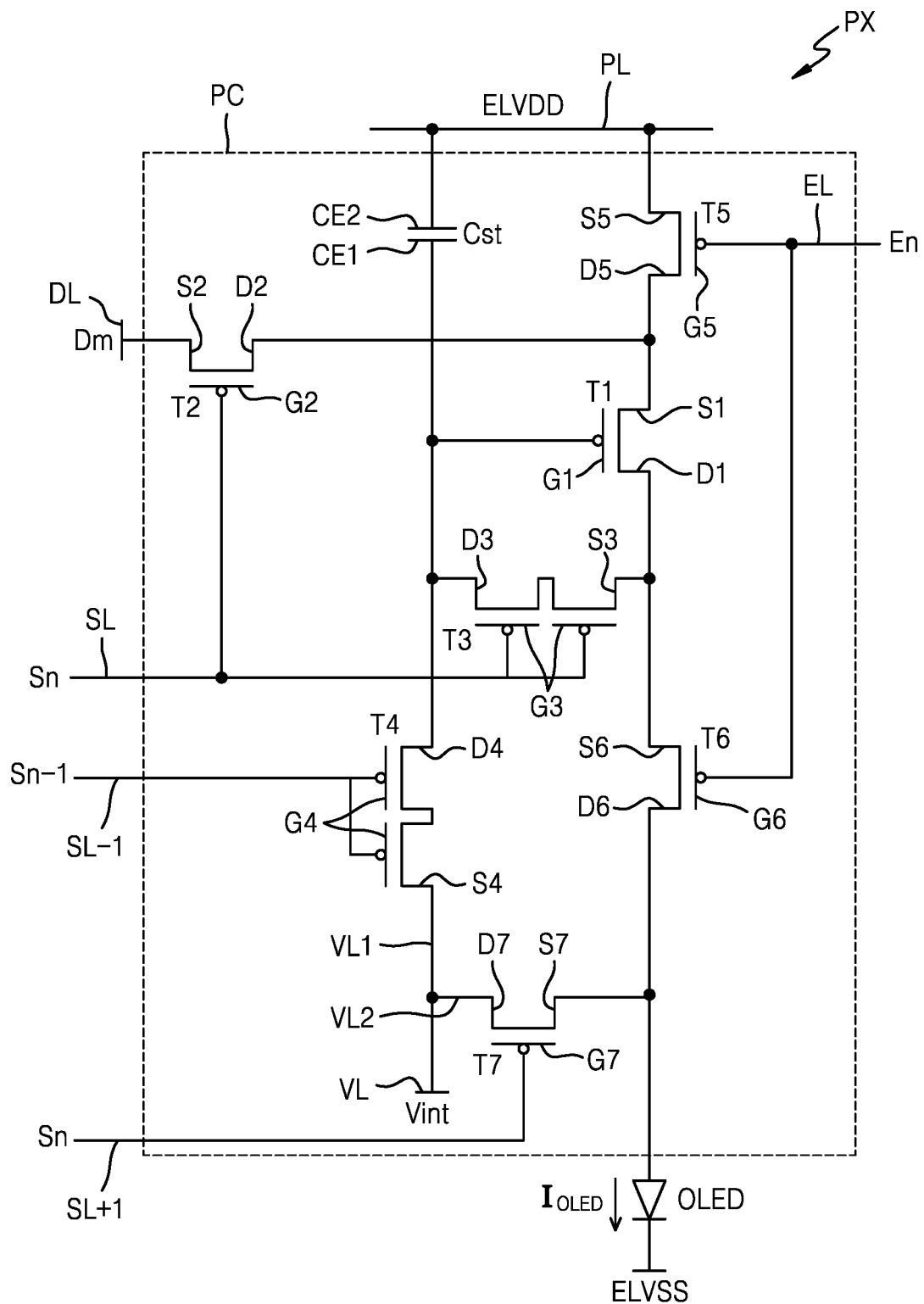
FIG. 4 is a circuit diagram of a pixel included in a display apparatus according to an exemplary embodiment of the present invention.
Figure 5:
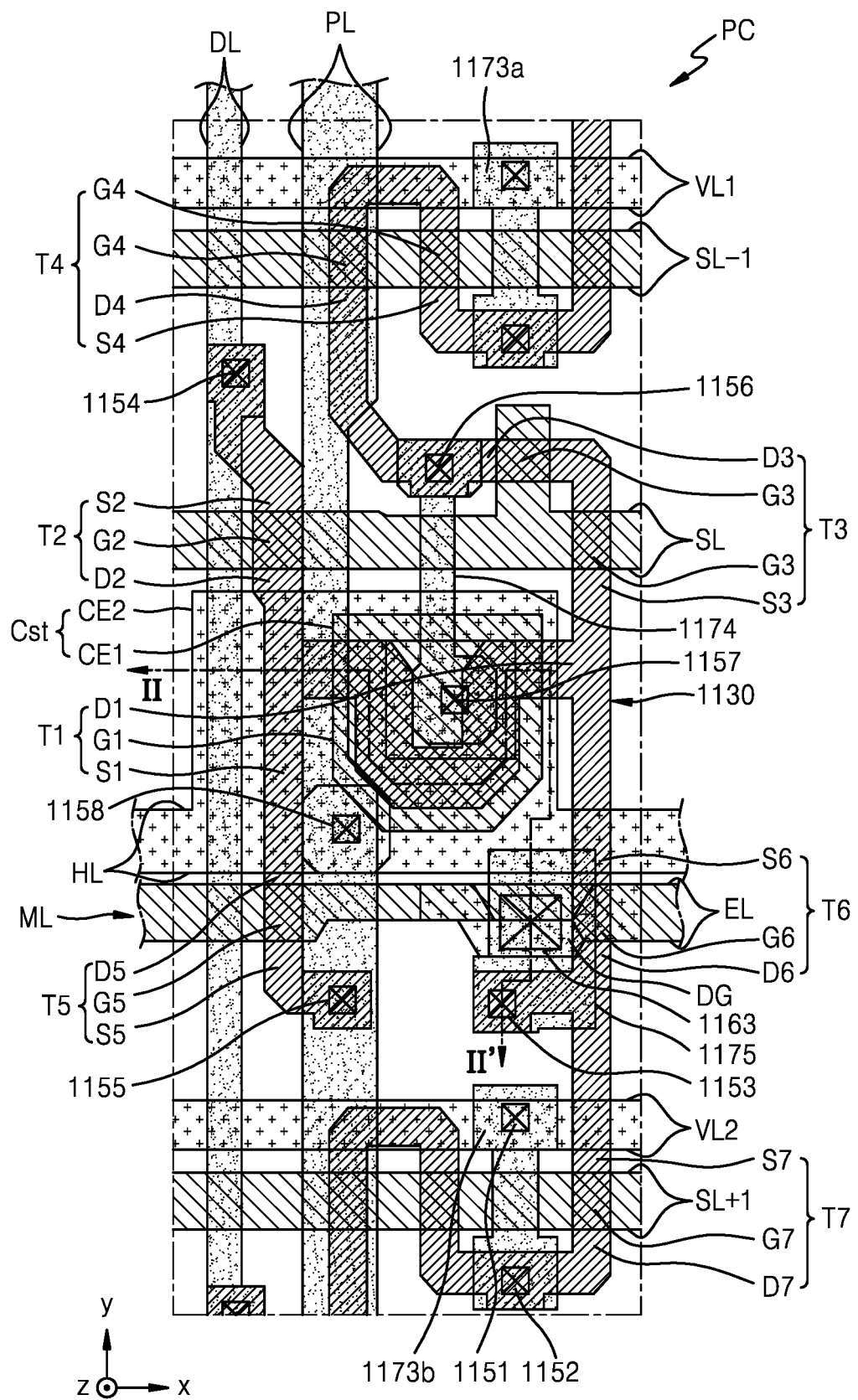
FIG. 5 is a plan view of a pixel circuit of a display apparatus according to an exemplary embodiment of the present invention.
Figure 6A:
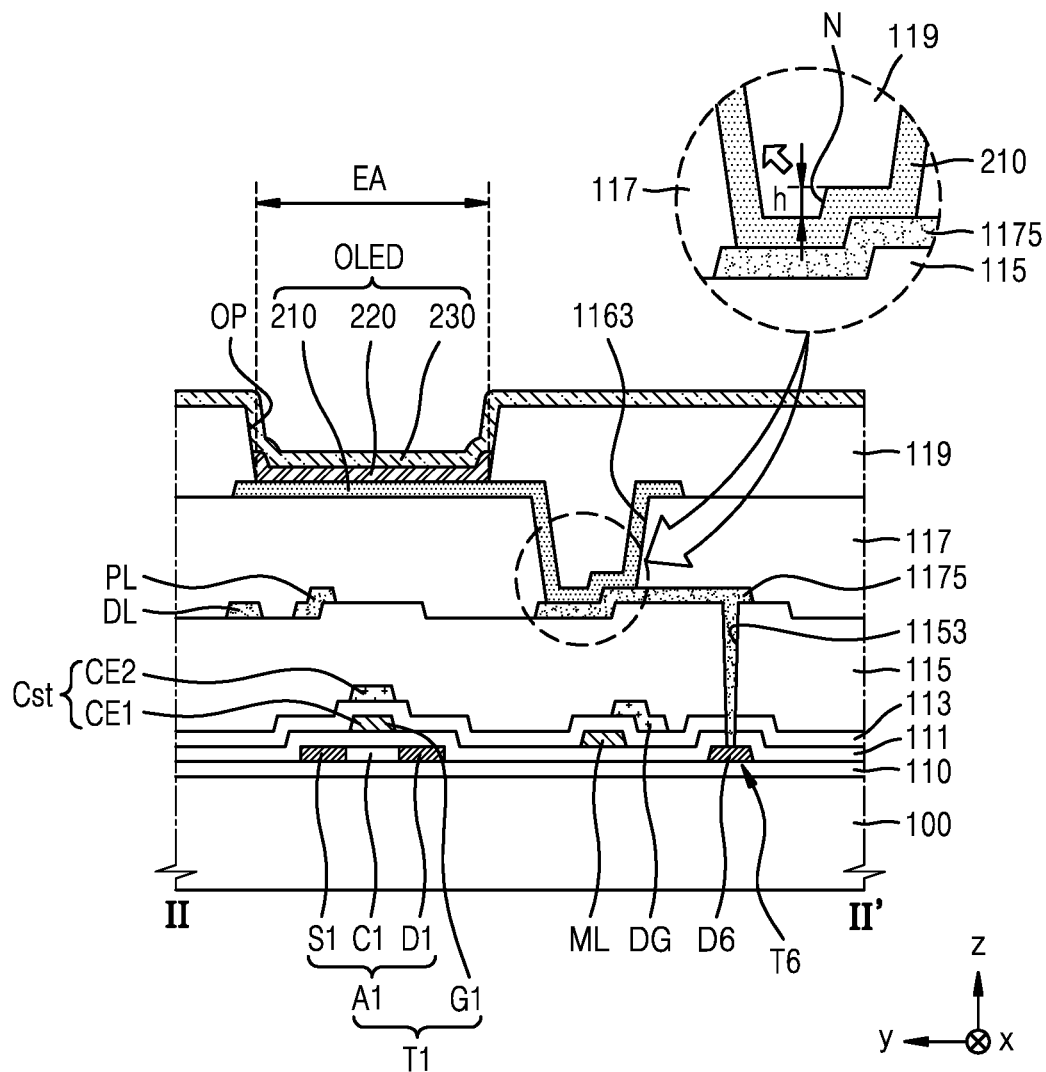
FIGS. 6A, 6B, and 6C are schematic cross-sectional views of the display apparatus taken along line II-II' of FIG. 5.
Figure 6B:
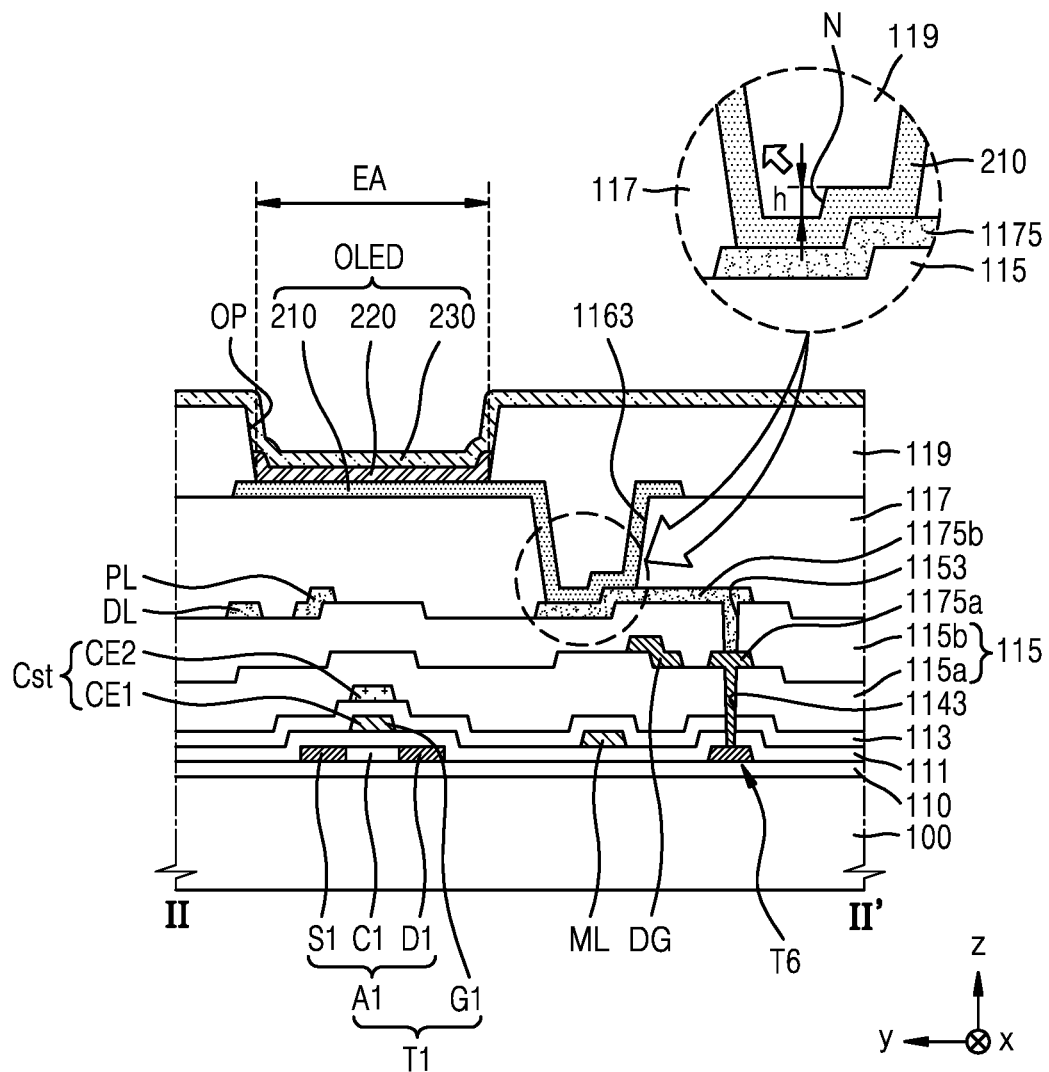
Figure 6C:
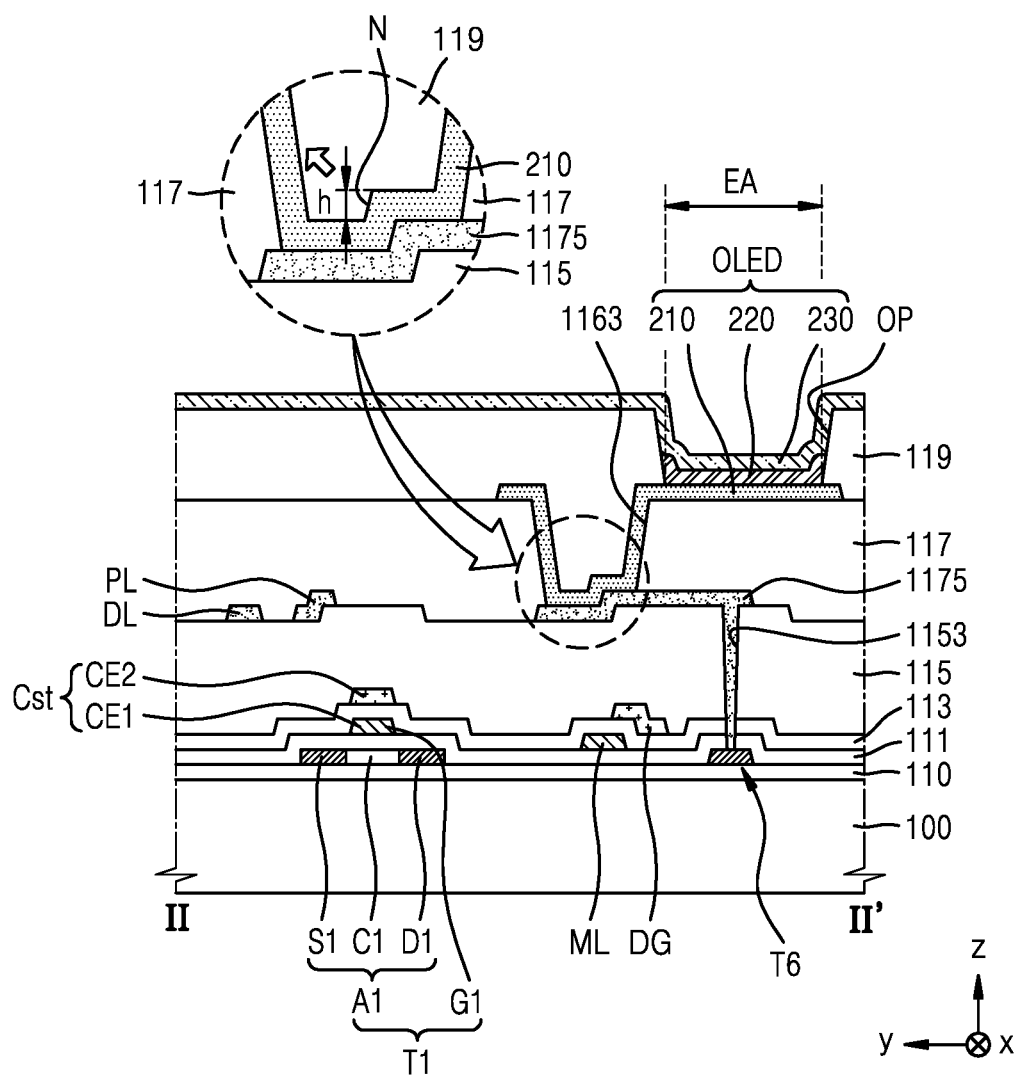

FIG. 4 is a circuit diagram of the pixel PX included in a display apparatus according to an exemplary embodiment of the present invention, and FIG. 5 is a plan view of the pixel circuit PC of a display apparatus according to an exemplary embodiment of the present invention. In addition, FIGS. 6A to 6C are schematic cross-sectional views of the display apparatus taken along line 11-11' of FIG. 5.

Referring to FIGS. 4 and 5, one pixel PX may include the pixel circuit PC and the organic light-emitting diode OLED electrically connected to the pixel circuit PC.

In an exemplary embodiment of the present invention, as shown in FIG. 4, the pixel circuit PC may include a plurality of TFTs T1 to T7 and the storage capacitor Cst. The TFTs T1 to T7 and the storage capacitor Cst may be connected to signal lines SL, SL−1, SL+1, EL, DL, a first initialization voltage line VL, a second initialization voltage line VL2, and the driving voltage line PL.

The signal lines SL, SL−1, SL+1, EL, DL may include the scan line S, a previous scan line SL−1, a following scan line SL+1, an emission control line EL, and a data line DL. The scan line SL is configured to deliver the scan signal Sn. The previous scan line SL−1 is configured to deliver a previous scan signal Sn−1. The following scan line SL+1 is configured to deliver the scan signal Sn to a second initialization TFT T7. The emission control line EL is configured to deliver an emission control signal En to an operation control TFT T5 and an emission control TFT T6. The data line DL crosses the scan line SL and is configured to deliver the data signal Dm. The driving voltage line PL may be configured to deliver the driving voltage ELVDD to the driving TFT T1. The first initialization voltage line VL1 may be configured to deliver an initialization voltage Vint to the first initialization TFT T4, and the second initialization voltage line VL2 may be configured to deliver the initialization voltage Vint to the second initialization TFT T7.

A driving gate electrode G1 of the driving TFT T1 may be connected to a lower electrode CE1 of the storage capacitor Cst. A driving source electrode S1 of the driving TFT T1 may be connected to the driving voltage line PL via the operation control TFT T5, and a driving drain electrode D1 of the driving TFT T1 may be electrically connected to a pixel electrode (210 in FIG. 6A) of the organic light-emitting diode OLED via the emission control TFT T6. The driving TFT T1 receives the data signal Dm according to a switching operation of the switching TFT T2 and supplies a driving current $I_{OLED}$ to the organic light-emitting diode OLED.

A switching gate electrode G2 of the switching TFT T2 may be connected to the scan line SL. A switching source electrode S2 of the switching TFT T2 may be connected to the data line DL, and a switching drain electrode D2 of the switching TFT T2 may be connected to the driving source electrode S1 of the driving TFT T1 and connected to the driving voltage line PL via the operation control TFT T5. The switching TFT T2 may be turned on according to the scan signal Sn received through the scan line SL and may perform a switching operation of transferring the data signal Dm transferred to the data line DL to the driving source electrode S1 of the driving TFT T1.

A compensation gate electrode G3 of a compensation TFT T3 may be connected to the scan line SL. A compensation source electrode S3 of the compensation TFT T3 may be connected to the driving drain electrode D1 of the driving TFT T1 and connected to the pixel electrode 210 of the organic light-emitting diode OLED via the emission control TFT T6, and a compensation drain electrode D3 of the compensation TFT T3 may be connected to the lower electrode CE1 of the storage capacitor Cst, a first initialization drain electrode D4 of the first initialization TFT T4, and the driving gate electrode G1 of the driving TFT T1. The compensation TFT T3 may be turned on according to the scan signal Sn received through the scan line SL and may be electrically connected to the driving gate electrode G1 and the driving drain electrode D1 of the driving TFT T1 to diode-connect the driving TFT T1.

A first initialization gate electrode G4 of the first initialization TFT T4 may be connected to the previous scan line SL−1. A first initialization source electrode S4 of the first initialization TFT T4 may be connected to the first initialization voltage line VL, and the first initialization drain electrode D4 of the first initialization TFT T4 may be connected to the lower electrode CE1 of the storage capacitor Cst, the compensation drain electrode D3 of the compensation TFT T3, and the driving gate electrode G1 of the driving TFT T1. The first initialization TFT T4 may be turned on according to the previous scan signal Sn−1 received through the previous scan line SL−1 and may be configured to deliver the initialization voltage Vint to the driving gate electrode G1 of the driving TFT T1 to perform an initialization operation of initializing a voltage of the driving gate electrode G1 of the driving TFT T1.

An operation control gate electrode G5 of the operation control TFT T5 may be connected to the emission control line EL. An operation control source electrode S5 of the operation control TFT T5 may be connected to the driving voltage line PL, and an operation control drain electrode D5 of the operation control TFT T5 may be connected to the driving source electrode S1 of the driving TFT T1 and the switching drain electrode D2 of the switching TFT T2.

An emission gate electrode G6 of the emission control TFT T6 may be connected to the emission control line EL. An emission control source electrode S6 of the emission control TFT T6 may be connected to the driving drain electrode D1 of the driving TFT T1 and the compensation source electrode S3 of the compensation TFT T3, and an emission control drain electrode D6 of the emission control TFT T6 may be electrically connected to a second initialization source electrode S7 of the second initialization TFT T7 and the pixel electrode 210 of the organic light-emitting diode OLED.

The operation control TFT T5 and the emission control TFT T6 may be turned on according to the emission control signal En, received through the emission control line EL, and the driving voltage ELVDD, received through the driving voltage line PL, may be transferred to the organic light-emitting diode OLED to allow the driving current $I_{OLED}$ to flow through the organic light-emitting diode OLED.

A second initialization gate electrode G7 of the second initialization TFT T7 is connected to the following scan line SL+1. The second initialization source electrode S7 of the second initialization TFT T7 is connected to the emission control drain electrode D6 of the emission control TFT T6 and the pixel electrode 210 of the organic light-emitting diode OLED, and a second initialization drain electrode D7 of the second initialization TFT T7 is connected to the second initialization voltage line VL2.

Since the scan line SL and the following scan line SL+1 are electrically connected to each other, the same scan signal Sn may be applied to the scan line SL and the following scan line SL+1. Accordingly, the second initialization TFT T7 may be turned on according to the scan signal Sn received through the following scan line SL+1 and perform an operation of initializing the pixel electrode 210 of the organic light-emitting diode OLED.

An upper electrode CE2 of the storage capacitor Cst is connected to the driving voltage line PL, and a common electrode of the organic light-emitting diode OLED is connected to the common voltage ELVSS. Accordingly, the organic light-emitting diode OLED may display an image by emitting light by receiving the driving current $Iou_D$ from the driving TFT T1.

Although FIG. 4 illustrates that the compensation TFT T3 and the first initialization TFT T4 have dual gate electrodes, the compensation TFT T3 and the first initialization TFT T4 may each have one gate electrode.

Hereinafter, a structure of the pixel PX will be described in detail below with reference to FIGS. 5, 6A, 6B, and 6C. FIGS. 68 and 6C correspond to modified exemplary embodiments of FIG. 6A. Exemplary embodiments of the present invention will be described with reference to FIG. 6A, and FIGS. 6B and 6C will be described based on differences from FIG. 6A.

The driving TFT T1, the switching TFT T2, the compensation TFT T3, the first initialization TFT T4, the operation control TFT T5, the emission control TFT T6, and the second initialization TFT T7 may be arranged along a semiconductor layer 1130, and some areas of the semiconductor layer 1130 may form semiconductor layers of the driving TFT T1, the switching TFT T2, the compensation TFT T3, the first initialization TFT T4, the operation control TFT T5, the emission control TFT T6, and the second initialization TFT T7.

The semiconductor layer 1130 may be formed on the substrate 100, and as shown in FIG. 6A, a buffer layer 110 may be formed on the substrate 100 and the semiconductor layer 1130 may be formed on the buffer layer 110. For example, the semiconductor layer 1130 may be formed above the buffer layer 110.

The substrate 100 may include, for example, glass or a polymer resin. The polymer resin may include, for example, polyethersulfone, polyacrylate, polyetherimide, polyethylene naphthalate, polyethylene terephthalate, polyphenylene sulfide, polyaryate, polyimide, polycarbonate, cellulose acetate propionate, or the like. The substrate 100 including the polymer resin may be flexible, rollable, or bendable. For example, the substrate 100 may have a multilayer structure including a layer including the above-stated polymer resin and an inorganic layer.

The buffer layer 110 may reduce or block penetration of foreign substances, moisture, or external air from a lower portion of the substrate 100 and may provide a flat surface on the substrate 100. The buffer layer 110 may include an inorganic material, such as an oxide or a nitride, an organic material, or an organic and inorganic composite, and the buffer layer 110 may include a single-layer structure or a multilayer structure of an inorganic material and an organic material.

For example, semiconductor layer 1130 may include a low temperature poly silicon (LTPS). A poly silicon material has high electron mobility (e.g., more than 100 $cm^2/Vs$), low energy consumption, and high reliability. In an exemplary embodiment of the present invention, the semiconductor layer 1130 may include amorphous silicon (a-Si) and/or an oxide semiconductor. Some semiconductor layers of the plurality of TFTs (T1 to T7) may include the LTPS, and other semiconductor layers of the plurality of TFTs (T1 to T7) may include the a-Si and/or the oxide semiconductor.

A first gate insulating layer 111 may be located on the semiconductor layer 1130, and the scan line SL, the previous scan line SL−1, the following scan line SL+1, and the emission control line EL may be located on the first gate insulating layer 111.

The first gate insulating layer 111 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

Areas of the scan line SL overlapping with channel areas of the switching TFT T2 and the compensation TFT T3 may respectively be the switching gate electrode G2 and the compensation gate electrode G3 An area of the previous scan line SL−1 overlapping a channel area of the first initialization TFT T4 may be the first initialization gate electrode G4. An area of the following scan line SL+1 overlapping a channel area of the second initialization TFT T7 may be the second initialization gate electrode G7, and areas of the emission control line EL respectively overlapping channel areas of the operation control TFT T5 and the emission control TFT T6 may respectively be the operation control gate electrode G5 and the emission control gate electrode G6.

A second gate insulating layer 113 may be provided on the scan line SL, the previous scan line SL−1, the following scan line SL+1, and the emission control line EL. The second gate insulating layer 113 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

An electrode voltage line HL, the first initialization voltage line VL, and the second initialization voltage line VL2 may be arranged on the second gate insulating layer 113. The electrode voltage line HL may cover at least a portion of the driving gate electrode G1 and may form the storage capacitor Cst together with the driving gate electrode G1.

The lower electrode CE1 of the storage capacitor Cst may be formed in a single-body with the driving gate electrode G1 of the driving TFT T1. For example, the driving gate electrode G1 of the driving TFT T1 may perform a function of the lower electrode CE1 of the storage capacitor Cst. An area of the electrode voltage line HL overlapping the driving gate electrode G1 may be the upper electrode CE2 of the storage capacitor Cst. Accordingly, the second gate insulating layer 113 may perform a function of a dielectric layer of the storage capacitor Cst.

According to an exemplary embodiment of the present invention, a step correction layer DG may be arranged on the second gate insulating layer 113. The step correction layer DG may have an isolated pattern. The step correction layer DG may be separated from the driving TFT T1 and may include the same material as that of the upper electrode CE2 of the storage capacitor Cst. For example, the upper electrode CE2 of the storage capacitor Cst and the step correction layer DG may include a single layer or a multilayer of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

An interlayer insulating layer 115 is located on the electrode voltage line HL, the first initialization voltage line VL1, and the second initialization voltage line VL2. The interlayer insulating layer 115 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The data line DL, the driving voltage line PL, first and second initialization connection lines 1173a and 1173b, a node connection line 1174, and an electrode layer 1175 may be arranged on the interlayer insulating layer 115. The data line DL, the driving voltage line PL, the node connection line 1174, and the electrode layer 1175 may include a conductive material such as Mo, Al, Cu, Ti, or the like, and may include a multilayer or a single layer including the above-stated material. In an exemplary embodiment of the present invention, the data line DL, the driving voltage line PL, the node connection line 1174, and the electrode layer 1175 may include a multilayer of Ti/Al/Ti.

The data line DL may be connected to a switching source area S2 of the switching TFT T2 through a contact hole 1154. A portion of the data line DL may be understood as the switching source electrode S2.

The driving voltage line PL may be connected to the upper electrode CE2 of the storage capacitor Cst through a contact hole 1158 formed in the interlayer insulating layer 115. Accordingly, the electrode voltage line HL may have the same voltage level (e.g., a constant voltage) as that of the driving voltage line PL. In addition, the driving voltage line PL may be connected to an operation control source area S5 through a contact hole 1155.

The first initialization voltage line VL1 may be connected to the first initialization TFT T4 through the first initialization connection line 1173a, and the second initialization voltage line VL2 may be connected to the second initialization TFT T7 through the second initialization connection line 1173b. The first initialization voltage line V1 and the second initialization voltage line VL2 may have the same constant voltage as each other (for example, -2V or the like).

An end of the node connection line 1174 may be connected to a compensation drain area D3 through a contact hole 1156, and another end of the node connection line 1174 may be connected to the driving gate electrode G1 through a contact hole 1157.

The electrode layer 1175 is connected to the semiconductor layer of the emission control TFT T6 through a contact hole 1153 penetrating the interlayer insulating layer 115, the second gate insulating layer 113, and the first gate insulating layer 111. The emission control TFT T6 may be electrically connected to the pixel electrode 210 of the organic light-emitting diode OLED through the electrode layer 1175.

A planarization layer 117 may be located on the data line DL, the driving voltage line PL, the first and second initialization connection lines 1173a and 1173b, the node connection line 1174, and the electrode layer 1175. The organic light-emitting diode OLED may be located on the planarization layer 117.

Although FIGS. 4 and 5 illustrate a structure of one pixel circuit PC, a plurality of pixels PX having substantially the same pixel circuit PC may be arranged in an x-direction and a y-direction, and the first initialization voltage line VL1, the previous scan line SL−1, the second initialization voltage line VL2, and the following scan line SL+1 may be shared by two pixel circuits PC arranged adjacent to each other in the y-direction. A pixel circuit arranged in the previous row may share the first initialization voltage line VI1 and the previous scan line SL−1, and a pixel circuit arranged in the subsequent row may share the second initialization voltage line VL2 and the following scan line SL+1.

For example, the first initialization voltage line V1 and the previous scan line SL−1 may be electrically connected to a second initialization TFT of other pixel circuit PC arranged adjacent to the pixel circuit PC shown in FIG. 5 in the y-direction with respect to FIG. 5. Accordingly, the previous scan signal Sn−1 applied to the previous scan line SL−1 may be transferred, as a following scan signal, to the second initialization TFT of the other pixel circuit PC. Similarly, the second initialization voltage line VL2 and the following scan line SL+1 may be electrically connected to a first initialization TFT of other pixel circuit PC arranged adjacent to the pixel circuit PC shown in FIG. 5 in the y-direction with respect to FIG. 5 to transfer the previous scan signal Sn−1 and the initialization voltage Vint.

Referring back to FIG. 6A, the planarization layer 117 may have a flat surface such that the pixel electrode 210 may be formed with a substantially flat surface. The planarization layer 117 may include a single layer or a multilayer of a film including an organic material. The planarization layer 117 may include, for example, benzocyclobutene (BCB), polyimide, hexamethyldisiloxane (HDMSO), a general commercial polymer such as poly(methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and a mixture thereof. The planarization layer 117 may include an inorganic material. In this case, the planarization layer 117 may include, for example, silicon oxide ($SiO_2$), silicon nitride ($SiN_x$), silicon oxynitride (SiON), aluminum oxide ($A_2O_5$), titanium oxide ($TiO_2$), tantalum oxide ($Ta_2O_5$), hafnium oxide ($HfO_2$), zinc oxide ($ZnO_2$), or the like. When the planarization layer 117 includes an inorganic material, a chemical planar polishing may be performed. The planarization layer 117 may include an organic material and an inorganic material.

The organic light-emitting diode OLED may include the pixel electrode 210, an opposite electrode 230, and an intermediate layer 220 located between the pixel electrode 210 and the opposite electrode 230 and including an emission layer.

The pixel electrode 210 may be connected to the electrode layer 1175 through a contact hole 1163, and the electrode layer 1175 may be connected to the emission control drain area D6 through the contact hole 1153.

The pixel electrode 210 may be a (semi)transparent electrode or a reflective electrode. In an exemplary embodiment of the present invention, the pixel electrode 210 may include a reflective film including, for example, Ag, Mg, Al, Pt, Pd, Au, Ni, Nd, Ir, Cr, a compound thereof, or the like, and a transparent or semi-transparent electrode layer formed on the reflective film. The transparent or semi-transparent electrode layer may include at least one of indium tin oxide (ITO), indium zinc oxide (IZO), zinc oxide (ZnO), indium oxide ($In_2O_3$) indium gallium oxide (IGO), and/or aluminum zinc oxide (AZO). In an exemplary embodiment of the present invention, the pixel electrode 210 may include a stacked structure with ITO/Ag/ITO.

A pixel defining layer 119 may be arranged on the planarization layer 117, and the pixel defining layer 119 may form an emission area EA of a pixel PX by having an opening OP exposing a central portion of the pixel electrode 210. In addition, the pixel defining layer 119 may prevent an arc or the like from being generated at an edge of the pixel electrode 210 by increasing a distance between the edge of the pixel electrode 210 and the opposite electrode 230 disposed on the pixel electrode 210. The pixel defining layer 119 may be formed of an organic insulating material such as polyimide, polyamide, acrylic resin, BCB, HMDSO, and phenol resin in a spin coating method or the like.

The intermediate layer 220 may include an organic emission layer. The organic emission layer may include an organic material including a fluorescent or phosphorescent material emitting red, green, blue, or white light. The organic emission layer may include a low-molecular-weight organic material or a polymer organic material, and a functional layer such as a hole transport layer (HTL), a hole injection layer (HIL), an electron transport layer (ETL), an electron injection layer (EIL), or the like may be further selectively arranged above or below the organic emission layer. The intermediate layer 220 may be arranged corresponding to each of a plurality of pixel electrodes 210. However, the present invention is not limited thereto. At least some of the layers included in the intermediate layer 220 may be formed as a single continuous body over the plurality of pixel electrodes 210.

For example, opposite electrode 230 may be a transparent electrode or a reflective electrode. In an exemplary embodiment of the present invention, the opposite electrode 230 may be a transparent or semi-transparent electrode, and may include a metal film having a small work function including lithium (Li), Ca, lithium fluoride (LiF)/Ca, F/Al, Ag, Mg, and a compound thereof. In addition, a transparent conductive oxide (TCO) film such as ITO, IZO, ZnO, $In_2O_3$, or the like may be further arranged above the metal thin film. The opposite electrode 230 may be formed in a single-body to correspond the plurality of pixel electrodes 210.

The display apparatus 1 (see FIG. 1) according to an exemplary embodiment of the present invention may include the step correction layer DG arranged between the substrate 100 and the interlayer insulating layer 115 and partially overlapping the contact hole 1163 exposing a portion of the electrode layer 1175 in the passivation layer 117.

Referring to FIG. 5, according to an exemplary embodiment of the present invention, a conductive line ML may be arranged between the substrate 100 and the step correction layer DG to extend in the x-direction, and may partially overlap the contact hole 1163. In an exemplary embodiment of the present invention, the conductive line ML may be the emission control line EL described above.

As shown in FIG. 6A, the conductive line ML may partially overlap the step correction layer DG. In an exemplary embodiment of the present invention, the conductive line ML and the step correction layer DG may not overlap to each other, and ends of the conductive line ML and ends of the step correction layer DG may coincide with each other. In an exemplary embodiment of the present invention, the ends of the conductive line ML and the ends of the step correction layer DG may be aligned with each other.

When the step correction layer DG partially overlapping the contact hole 1163 is included, the interlayer insulating layer 115 arranged on the step correction layer DG may be formed along the step correction layer DG. In addition, the electrode layer 1175 arranged on the interlayer insulating layer 115 and connected to the emission control drain area D6 of the emission control TFT T6 may be formed along the step correction layer DG.

The pixel electrode 210 may be in contact with the electrode layer 1175 through the contact hole 1163, and a portion of the pixel electrode 210, which is in contact with the electrode layer 1175, may be formed to correspond to the shape of the step correction layer DG. In other words, a top surface of the pixel electrode 210 overlapping the conductive line ML may be lower than a top surface of the pixel electrode 210 overlapping the step correction layer DG.

For example, the pixel electrode 210 may extend in a y-direction (e.g., a +y-direction) and the opening OP of the pixel defining layer 119 may be located on a +y-direction side with respect to the contact hole 1163. For example, the opening OP may be positioned to the left of the contact hole 1163. In addition, referring to FIG. 6A showing an enlarged view of the pixel electrode 210 and the electrode layer 1175, the pixel electrode 210 may have a step h lowered in the +y-direction by the step correction layer DG.

In other words, a lower top surface among top surfaces of the pixel electrode 210, which overlap the electrode layer 1175 exposed by the contact hole 1163, may be adjacent to the emission area EA, and the step h of the pixel electrode 210 may have an inclined surface N facing the emission area EA. For example, the top surface of the pixel electrode 210 overlapping the conductive line ML may be closer to the emission area EA than the top surface of the pixel electrode 210 overlapping the step correction layer DG. For example, a lower bottom surface opposite to the lower top surface of the pixel electrode 210 may be in contact with the electrode layer 1175.

External light or the like moving toward an inner surface of the substrate 100 may be reflected back to the outside through the pixel electrode 210, which is a reflective electrode. Thus, when the pixel electrode 210 includes the step h lowered in the +y-direction by the step correction layer DG, the external light or the like may be reflected by the step h of the pixel electrode 210 in a direction toward the emission area EA (see the arrow in FIG. 6A).

Although FIG. 6A illustrates that the pixel electrode 210 extends in the +y-direction, the pixel electrode 210 may extend in a −y-direction, as shown in FIG. 6C. When a portion of the pixel electrode 210 in contact with the electrode layer 1175 has the step h which is still lowered in the +y-direction by the step correction layer DG, in contrast to FIG. 6A, the external light or the like moving toward the inner surface of the substrate 100 may be reflected by the step h of the pixel electrode 210 in a direction toward an area in which the emission area EA does not exist (see the arrow in FIG. 6C).

In FIG. 6A and FIG. 6C, the +y-direction and the −y-direction are used, but these are for convenience of description and may be respectively arranged symmetrically from side to side differently from those shown. For example, according to an exemplary embodiment of the present invention, as shown in FIG. 6A, the lower top surface, which overlaps the conductive line ML, among the top surfaces of the pixel electrode 210, which overlap the electrode layer 1175 exposed by the contact hole 1163, may be more adjacent to the emission area EA than a higher top surface of the pixel electrode 210, which overlaps the step correction layer DG.

In addition, as shown in FIG. 6C, the higher top surface, which overlaps the step correction layer DG, among the top surfaces of the pixel electrode 210 may be more adjacent to the emission area EA than the lower top surface of the pixel electrode 210, which overlaps the conductive line ML.

According to an exemplary embodiment of the present invention, when the step correction layer DG arranged between the substrate 100 and the interlayer insulating layer 115 and partially overlapping the contact hole 1163 is included, a direction of the step h of the pixel electrode 210 in the contact hole 1163 may be adjusted through the step correction layer DG, and a direction in which the external light or the like is reflected by the pixel electrode 210 in the contact hole 1163 may be adjusted.

Although FIG. 6A illustrates that the interlayer insulating layer 115 is arranged between the electrode layer 1175 and the step correction layer DG, as shown in FIG. 6B, the interlayer insulating layer 115 may include a first interlayer insulating layer 115a and a second interlayer insulating layer 115b, and the step correction layer DG may be arranged on the first interlayer insulating layer 115a.

The pixel electrode 210 may be in contact with a second electrode layer 1175b through the contact hole 1163, and the second electrode layer 1175b may be connected to a first electrode layer 1175a through the contact hole 1153 formed in the second interlayer insulating layer 115b. In addition, the first electrode layer 1175a may be connected to the emission control TFT T6 through a contact hole 1143. The step correction layer DG may be arranged on the same layer as the first electrode layer 1175a, and the step correction layer DG may include the same material as that of the first electrode layer 1175sa.

Figure 7A:
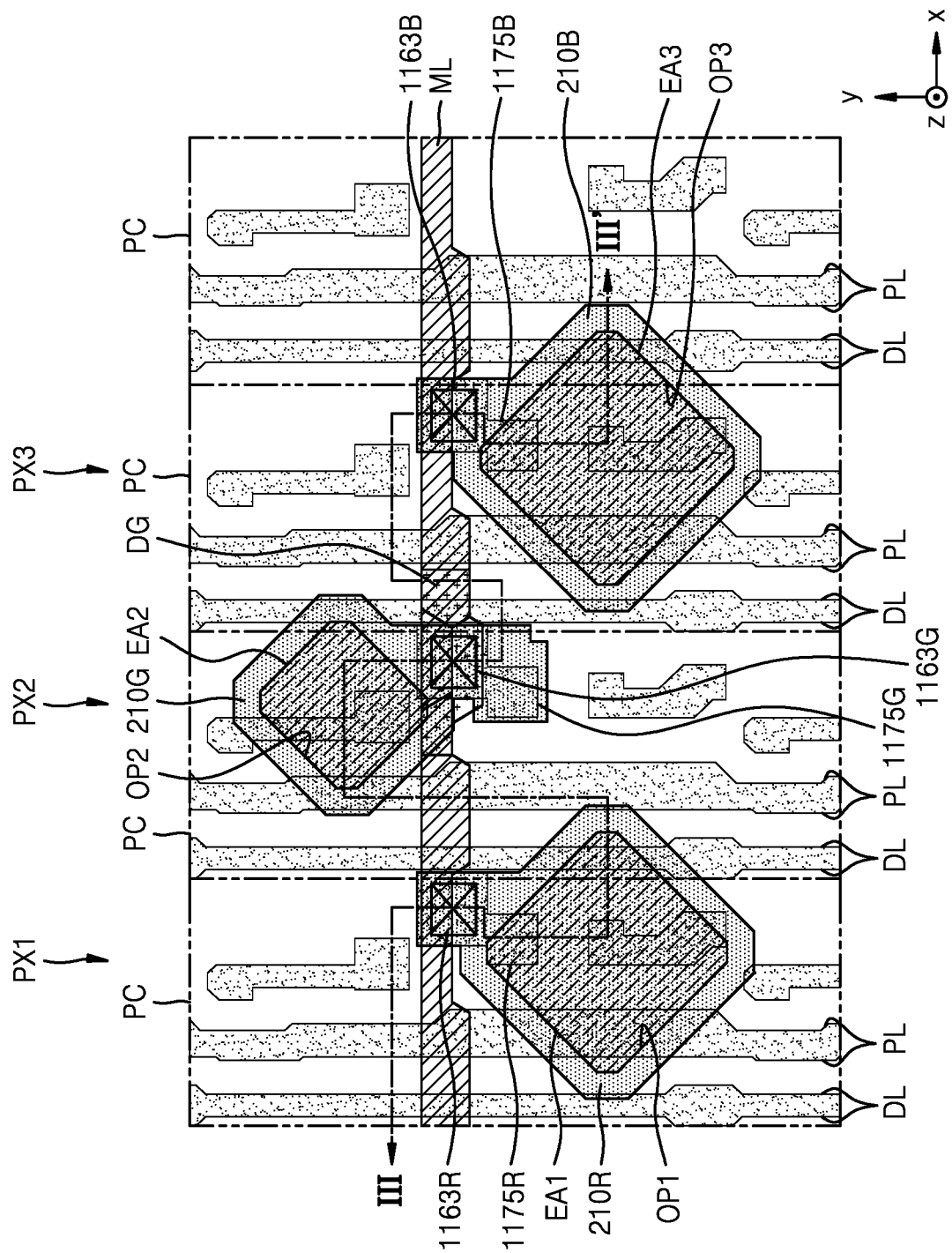
FIG. 7A is a schematic plan view of a portion of a display apparatus according to an exemplary embodiment of the present invention.
Figure 7B:
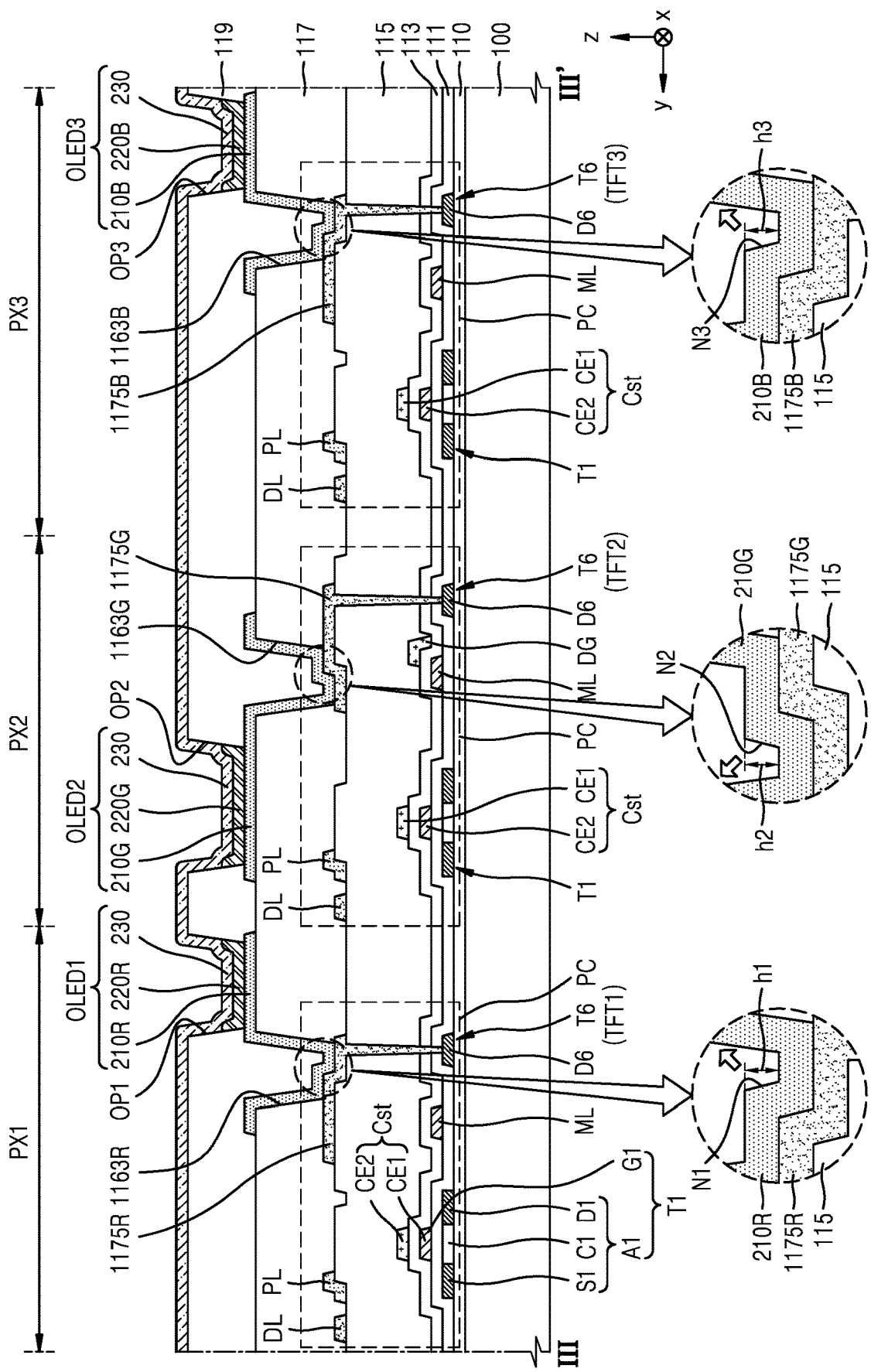
FIG. 7B is a schematic cross-sectional view of the display apparatus taken along line III-III' of FIG. 7A.

FIG. 7A is a schematic plan view of a portion of a display apparatus according to an exemplary embodiment of the present invention, and FIG. 7B is a schematic cross-sectional view of the display apparatus taken along line III-III' of FIG. 7A. In FIG. 7B, reference numerals that are the same as those in FIG. 6A may refer to the same members or elements in FIG. 6A, and redundant descriptions thereof may be omitted.

FIG. 7A illustrates that the plurality of pixels PX may be arranged on the display area DA (see FIG. 1) of the display apparatus 1 (see FIG. 1). For example, a first pixel PX1, a second pixel PX2, and a third pixel PX3 may be arranged in the display area DA. Although FIG. 7A illustrates that the first pixel PX1, the second pixel PX2, and the third pixel PX3 are arranged in a pentile type, the number and the arrangement of the pixels may vary.

According to an exemplary embodiment of the present invention, a first pixel electrode 210R of the first pixel PX1 and a third pixel electrode 210B of the third pixel PX3 may extend in a first direction. In an exemplary embodiment of the present invention, as shown in FIG. 7A, the first direction may be a −y-direction, and the first pixel electrode 210R and the third pixel electrode 210B may extend in the −y-direction.

For example, a first opening OP1 and a third opening OP3 respectively forming a first emission area EA1 of the first pixel electrode 210R and a third emission area EA3 of the third pixel electrode 210B may be respectively located on a −y-direction side with respect to a first contact hole 1163R and a third contact hole 1163B in a plan view. For example, the first opening OP1 may be positioned to the right of the first contact hole 1163R, and the third opening OP3 may be positioned to the right of the third contact hole 1163B. As an additional example, the first contact hole 1163R and the first opening OP may be sequentially arranged in the −y-direction, and the third contact hole 1163b and the third opening OP3 may be sequentially arranged in the −y-direction.

In addition, a second pixel electrode 210G of the second pixel PX2 may extend in a second direction opposite to the first direction. In an exemplary embodiment of the present invention, as shown in FIG. 7A, the second direction may be a +y-direction, and the second pixel electrode 210G may extend in the +y-direction.

In other words, a second opening OP2 forming a second emission area EA2 of the second pixel electrode 210G may be located on a +y-direction side with respect to a second contact hole 1163G. For example, the second opening OP2 may be positioned to the left of the second contact hole 1163G. As an additional example, the second opening OP2 and the second contact hole 1163G may be sequentially arranged in the −y-direction.

The conductive line ML may pass through the first contact hole 1163R, the second contact hole 1163G, and the third contact hole 1163B to extend in a third direction crossing the first direction and the second direction. The first pixel electrode 210R, the second pixel electrode 210G, and the third pixel electrode 210B respectively extend in the first direction and the second direction, and respectively overlap a portion of the first contact hole 1163R, a portion of the second contact hole 1163G, and a portion of the third contact hole 1163B. In an exemplary embodiment of the present invention, the conductive line ML may correspond to the above-stated emission control line EL. Herein, the third direction is an x-direction.

Although FIG. 7A illustrates that the conductive line ML partially overlaps and pass through an upper portion of areas of the first to third contact holes 1163R, 1163G, and 1163B with respect to a center of FIG. 7A, the conductive line ML may partially overlap and pass through a lower portion of the areas of the first to third contact holes 1163R, 1163G, and 1163B. For example, the conductive line ML shown in FIG. 7A may overlap some portions of the first to third contact holes 1163R, 1163G, and 1163B by extending in the x-direction in parallel. For example, the conductive line ML may have a large enough width in the −y-direction to overlap the first to third contact holes 1163R, 1163G, and 1163B.

In an exemplary embodiment of the present invention, the step correction layer DG may be arranged to partially overlap a portion of the second contact hole 1163G of the second pixel PX2. In this case, the second pixel electrodes 210G of the second pixel PX2 extends in a direction different from that of the first and third pixel electrodes 210R and 210B of the first and third pixels PX1 and PX3. Herein, the step correction layer DG may partially overlap the conductive line ML. In an exemplary embodiment of the present invention, the step correction layer DG may not overlap the conductive line ML, and ends of the conductive line ML and ends of the step correction layer DG may coincide with each other.

Referring to FIG. 7B, a first TFT TFT1 may include a first electrode layer 1175R, a second TFT TFT2 may include a second electrode layer 1175G, and a third TFT TFT3 may include a third electrode layer 1175B. In an exemplary embodiment of the present invention, the first to third TFTs TFT1, TFT2, and TFT3 may correspond to the emission control TFT T6 in each pixel circuit PC.

Referring to FIG. 7B showing an enlarged view of the display apparatus, a top surface of the first pixel electrode 210R, in contact with the first electrode layer 1175R exposed by the first contact hole 1163R, may have a first step h1 lowered in a first direction (for example, a −y-direction). In addition, a top surface of the second pixel electrode 210G, in contact with the second electrode layer 1175G exposed by the second contact hole 1163G, may have a second step h2 lowered in a second direction opposite to the first direction (for example, a +y-direction). For example, the sloped surface of the first step h1 may face the first direction, and the sloped surface of the second step h2 may face the second direction. In addition, a top surface of the third pixel electrode 210B, in contact with the third electrode layer 1175B exposed by the third contact hole 1163B, may have a third step h3 lowered in the first direction (for example the −y-direction). For example, the sloped surface of the third step h3 may face the first direction.

For example, lower top surfaces among top surfaces of lower portions of the first to third pixel electrodes 210R, 210G, and 210B, which are respectively in contact with the first to third electrode layers 1175R, 1175G, and 1175, respectively exposed by the first to third contact holes 1163R, 1163G, and 1163B may be more adjacent to the first to third emission areas EA, EA2, and EA3 than higher top surfaces of the lower portions of the first to third pixel electrodes 210R, 210G, and 210B.

In an exemplary embodiment of the present invention, the first to third steps h1, h2, and h3 of the first to third pixel electrodes 210R, 210G, and 210B may respectively have first to third inclined surfaces N1, N2, and N3 inclined toward first to third emission areas EA1, EA2, and EA3. For example, the first to third inclined surface N1, N2 and N3 may each face in a direction to which their respective emission area EA1, EA2, and EA3 is located.

In an exemplary embodiment of the present invention, the first pixel PX1 and the third pixel PX3 may form the top surfaces of the first pixel electrode 210R and the third pixel electrode 210B overlapping the conductive line ML above the first and third steps h1 and h3, and the second pixel PX2 may form the top surface of a lower portion of the second pixel electrode 210G overlapping the step correction layer DG above a lower surface of the lower portion of the second pixel electrode 210G.

According to an exemplary embodiment of the present invention, the lower top surfaces among the top surfaces of the first to third pixel electrodes 210R, 210G, and 210B, which are respectively in contact with the first to third electrode layers 1175R, 1175G, and 1175B respectively exposed by the first to third contact holes 1163R, 1163G, and 1163B, may be uniformly formed to be respectively more adjacent to the first to third emission areas EA1, EA2, and EA3 than the higher top surfaces of the first to third pixel electrodes 210R, 210G, and 210B.

In an exemplary embodiment of the present invention, first to third intermediate layers 220R, 220G, and 220B may be respectively arranged on the first to third pixel electrodes 210R, 210G, and 210B, and the opposite electrode 230 covering the first to third intermediate layers 220R, 220G, and 220B may be arranged. For example, the first intermediate layer 220R may emit red light, the second intermediate layer 220G may emit green light, and the third intermediate layer 220B may emit blue light.

In an exemplary embodiment of the present invention, the first and third intermediate layers 220R and 220B may emit light having a green wavelength, and the second intermediate layer 220G may emit light having a red or blue wavelength.

In a comparative embodiment, the step correction layer may be omitted. When the pixels are arranged in a pentile type, directions in which pixel electrodes extend are shifted from each other. Generally, a pixel electrode of a pixel emitting red or blue light and a pixel electrode of a pixel emitting green light are arranged opposite to each other. In the case of the pixel emitting green light where a step correction layer is omitted, a higher top surface among top surfaces of the pixel electrode which are in contact with an electrode layer exposed by a contact hole is adjacent to an emission area. That is, a step direction of the pixel electrode of the pixel emitting green light is formed to be opposite to a step direction of the pixel electrode of the pixel emitting red or blue light.

External light or the like moving toward the inner surface of a substrate is reflected back to the outside by the pixel electrode. In addition, the pixel emitting red or blue light reflects the external light or the like toward the emission area, and the pixel emitting green light reflects the external light or the like away from the emission area. In this case, since the directions in which the external light or the like is reflected are not the same, a separation phenomenon into magenta and green colors mixed with red and blue colors may occur.

In an exemplary embodiment of the present invention, the step correction layer DG is arranged in the second pixel PX2. In this case, the second pixel electrode 210G of the second pixel PX2 extend in a direction opposite to that of the first and third pixel electrodes 210R and 210B of the first and third pixels PX1 and PX3. In this case, the first and third pixel electrodes 210R and 210B may respectively have the first and third steps h1 and h3 lowered in the −y-direction, and the second pixel electrode 210G may have the second step h2 lowered in the +y-direction by the step correction layer DG.

For example, directions in which the first to third steps h1, h2, and h3 of the first to third pixel electrodes 210R, 210G, and 210B are lowered may be uniformly formed to face the first to third emission areas EA1, EA2, and EA3. In this case, the external light or the like coming toward the inner surface of the substrate 100 may be reflected in directions toward each of the first to third emission areas EA, EA2, and EA3 by the first to third steps h1, h2, and h3 of the first to third pixel electrodes 210R, 210G, and 210B. Accordingly, the directions in which the external light or the like is reflected may be the same, and a separation phenomenon into magenta and green colors mixed with red and blue colors may be improved.

Figure 8A:
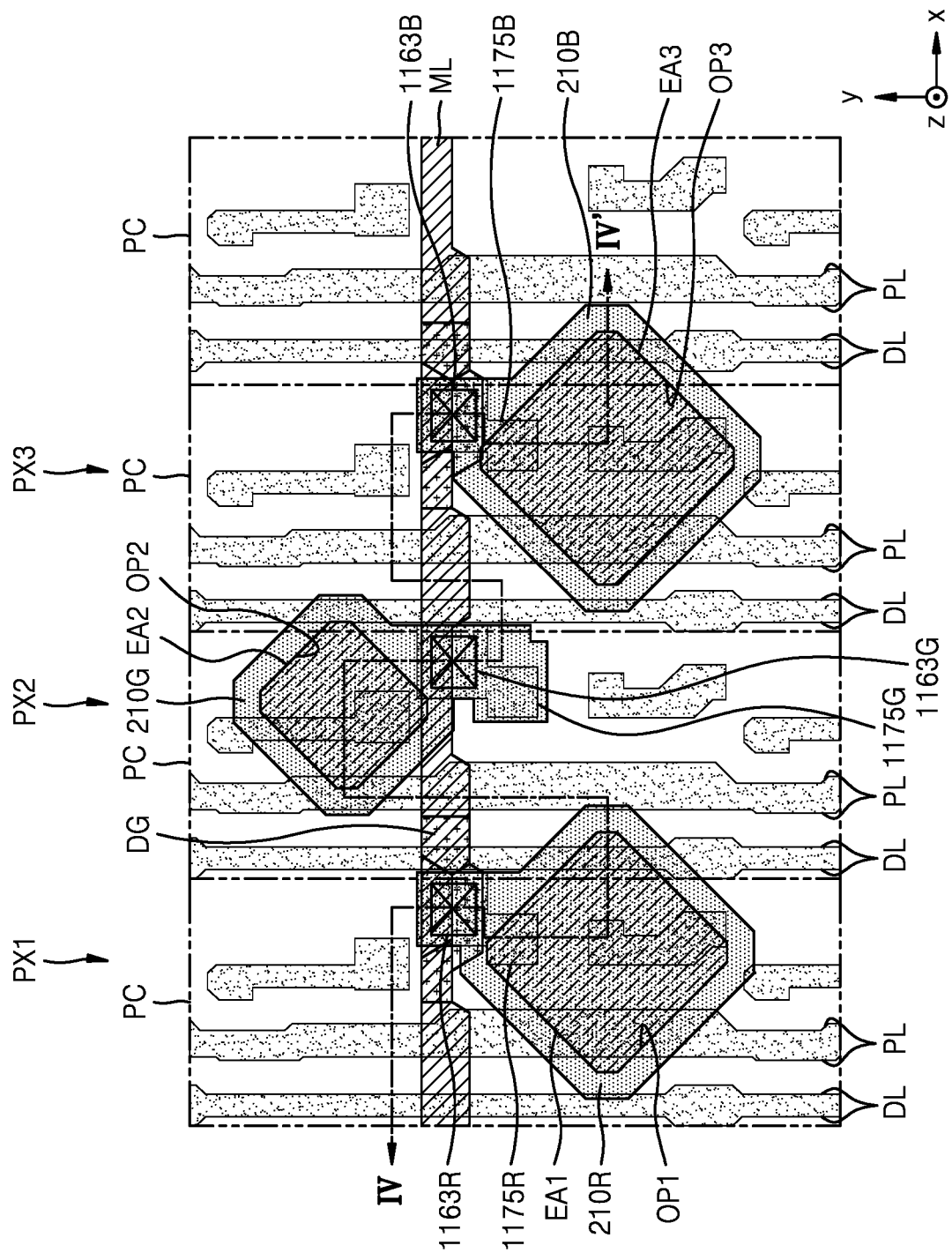
FIG. 8A is a schematic plan view of a portion of a display apparatus according to an exemplary embodiment of the present invention.
Figure 8B:
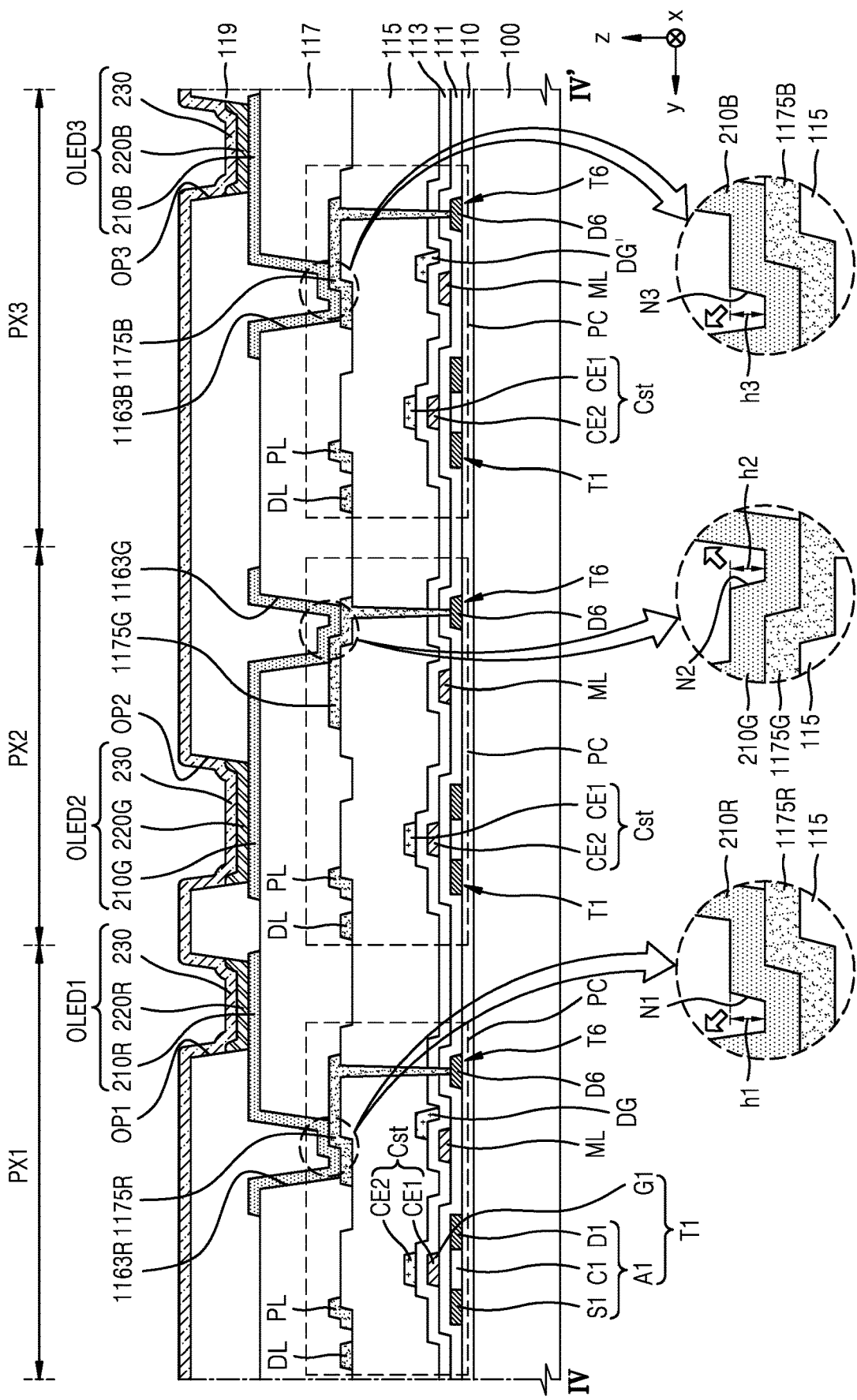
FIG. 8B is a schematic cross-sectional view of the display apparatus taken along line IV-IV' of FIG. 8A.

FIG. 8A is a schematic plan view of a portion of a display apparatus according to an exemplary embodiment of the present invention, and FIG. 8B is a schematic cross-sectional view of the display apparatus taken along line IV-IV' of FIG. 8A. In FIGS. 8A and 8B, reference numerals that are the same as those in FIGS. 7A and 7B may refer to the same members or elements, and redundant descriptions thereof may be omitted.

In an exemplary embodiment of the present invention, the first pixel electrode 210R of the first pixel PX1 and the third pixel electrode 210B of the third pixel PX3 may extend in the first direction. In an exemplary embodiment of the present invention, as shown in FIG. 8A, the first direction may be the −y-direction, and the first pixel electrode 210R and the third pixel electrode 210B may extend in the −y-direction.

For example, the first opening OP1 and the third opening OP3 respectively forming the first emission area EA1 of the first pixel electrode 210R and the third emission area EA3 of the third pixel electrode 210B may be respectively located in the −y-direction side with respect to the first contact hole 1163R and the third contact hole 1163B.

In addition, the second pixel electrode 210G of the second pixel PX2 may extend in the second direction opposite to the first direction. In an exemplary embodiment of the present invention, as shown in FIG. 8A, the second direction may be the +y-direction, and the second pixel electrode 210G may extend in the +y-direction.

In other words, the second opening OP2 providing the second emission area EA2 of the second pixel electrode 210G may be located in the +y-direction side with respect to a second contact hole 1163G. For example, the second emission area EA2 may be positioned to the left of the second contact hole 1163G.

The conductive line ML may pass through the first contact hole 1163R, the second contact hole 1163G, and the third contact hole 1163B to extend in the third direction crossing the first direction and the second direction, in which the first pixel electrode 210R, the second pixel electrode 210G, and the third pixel electrode 210B respectively extend. In addition, the conductive line ML may overlap a portion of the first contact hole 1163R, a portion of the second contact hole 1163G, and a portion of the third contact hole 1163B. In an exemplary embodiment of the present invention, the conductive line ML may correspond to the above-stated emission control line EL. Herein, the third direction is the x-direction.

Although FIG. 8A illustrates that the conductive line ML partially overlaps and pass through the upper portions of the first to third contact holes 1163R, 1163G, and 1163, the conductive line ML may partially overlap and pass through the lower portions of the first to third contact holes 1163R, 1163G, and 1163B. In other words, the conductive line ML shown in FIG. 8A may be arranged by moving in parallel in the −y-direction. For example, the conductive line ML may extend in the x-direction and the −y-direction.

In an exemplary embodiment of the present invention, the conductive line ML may partially overlap and pass through the upper portions of the first to third contact holes 1163R, 1163G, and 1163B in a plan view.

In an exemplary embodiment of the present invention, step correction layers DG and DG' each may be arranged to partially overlap the first and third contact holes 1163R and 1163B of the first and third pixels PX1 and PX3, respectively. In this case, the first and third pixel electrodes 210R and 210B of the first pixel PX1 and the third pixel PX3 extend in a different direction from that of the second pixel electrode 210G of the second pixel PX2. Herein, the step correction layers DG and DG may partially overlap the conductive line ML. In an exemplary embodiment of the present invention, the step correction layers DG and DG' may not overlap the conductive line ML, and ends of the step correction layers DG and DG' may coincide with ends of the conductive line ML.

Referring to FIG. 8B showing an enlarged view of the display apparatus, a top surface of the first pixel electrode 210R overlapping the first electrode layer 1175R exposed by the first contact hole 1163R may have the first step h1 lowered in the first direction (for example, the +y-direction), and a top surface of the second pixel electrode 210G overlapping the second electrode layer 1175G exposed by the second contact hole 1163G may have the second step h2 lowered in the second direction opposite to the first direction (for example, the −y-direction). In addition, a top surface of the third pixel electrode 210B overlapping the third electrode layer 1175B exposed by the third contact hole 1163B may have the third step h3 lowered in the first direction (for example the +y-direction).

For example, a lower top surfaces among the top surfaces of the first to third pixel electrodes 210R, 210G, and 210B which are respectively overlapping the first to third electrode layers 1175R, 1175G, and 1175B respectively exposed by the first to third contact holes 1163R, 1163G, and 1163B may be more adjacent to the first to third emission areas EA, EA2, and EA3 than higher top surfaces of the first to third pixel electrodes 210R, 210G, and 210B.

In an exemplary embodiment of the present invention, the first and third steps h1 and h3 of the first and third pixel electrodes 210R and 210B may have the first and third inclined surfaces N1 and N3 inclined toward the +y-direction, and the second step h2 of the second pixel electrode 210G may have the second inclined surface N2 inclined toward the −y-direction.

In an exemplary embodiment of the present invention, the first pixel PX1 and the third pixel PX3 may be formed with the top surfaces, of the first pixel electrode 210R and the third pixel electrode 210B, overlapping the step correction layers DG and DG' that are high, and the second pixel PX2 may be formed with the top surface, of the second pixel electrode 210G, overlapping the conductive line ML that are high. For example, the top surfaces, of lower portions of the first pixel electrode 210R and the third pixel electrode 210B, overlapping the step correction layer DG and DG' may be formed higher than other top surfaces of the lower portions not overlapping the step correction layers DG and DG'. As an additional example, the top surface, of a lower portion of the second pixel electrode 210G, overlapping the conductive line ML may be formed higher than another top surface of the lower portion not overlapping the conductive line ML.

According to an exemplary embodiment of the present invention, the lower top surfaces among the top surfaces of the first to third pixel electrodes 210R, 210G, and 210B, which are respectively overlapping the first to third electrode layers 1175R, 1175G, and 1175B exposed by the first to third contact holes 1163R, 1163G, and 1163B, may be uniformly formed to be, respectively, further away from the first to third emission areas EA1, EA2, and EA3 than the higher top surfaces of the first to third pixel electrodes 210R, 210G, and 2108 respectively overlapping the first to third electrode layers 1175R, 1175G, and 11758 exposed by the first to third contact holes 1163R, 1163G, and 1163B.

In an exemplary embodiment of the present invention, the first intermediate layer 220R may emit red light, the second intermediate layer 220G may emit green light, and the third intermediate layer 220B may emit blue light. In an exemplary embodiment of the present invention, the first and third intermediate layers 220R and 220B may emit green light, and the second intermediate layer 220G may emit red or blue light.

In an exemplary embodiment of the present invention, step correction layers DG and DG' may be arranged in the first and third pixels PX1 and PX3. In this case, the first and third pixel electrodes 210R and 210B of the first and third pixels PX1 and PX3 extend in a direction opposite to that of the second pixel electrode 210G of the second pixel PX2. In this case, directions in which the first to third steps h1, h2, and h3 of the first to third pixel electrodes 210R, 210G, and 210B are lowered may be uniformly formed to be away from the first to third emission areas EA1, EA2, and EA3.

For example, the external light or the like moving toward the inner surface of the substrate 100 may be reflected in a direction away from each of first to third organic light emitting diodes OLED1, OLED2, and OLED3 by the first to third steps h1, h2, and h3 of the first to third pixel electrodes 210R, 210G, and 210B. Accordingly, the directions in which the external light or the like is reflected may be the same, and thus, a separation phenomenon into magenta and green colors mixed with red and blue colors may be improved.

Figure 9:
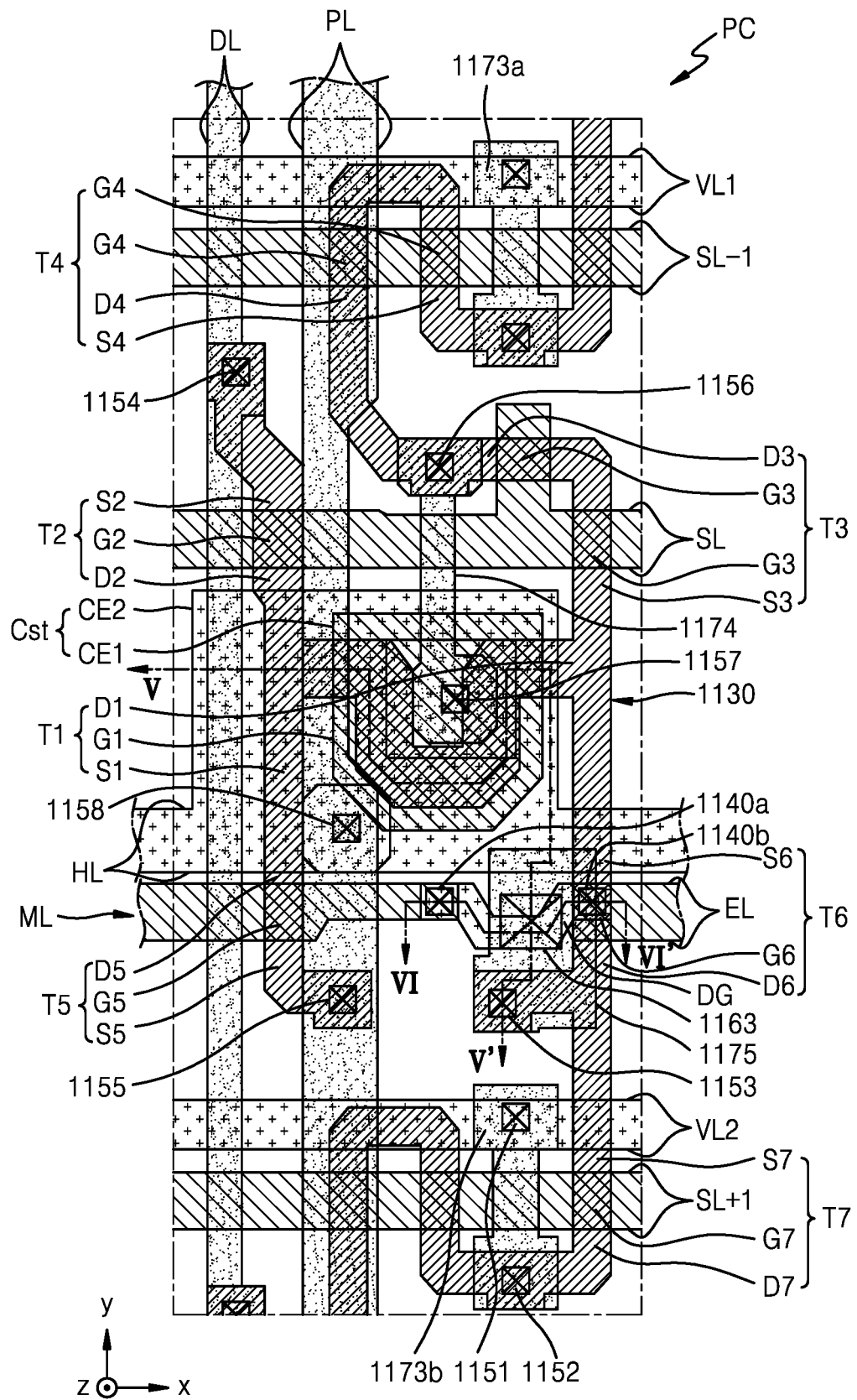
FIG. 9 is a plan view of a pixel circuit of a display apparatus according to an exemplary embodiment of the present invention.
Figure 10A:
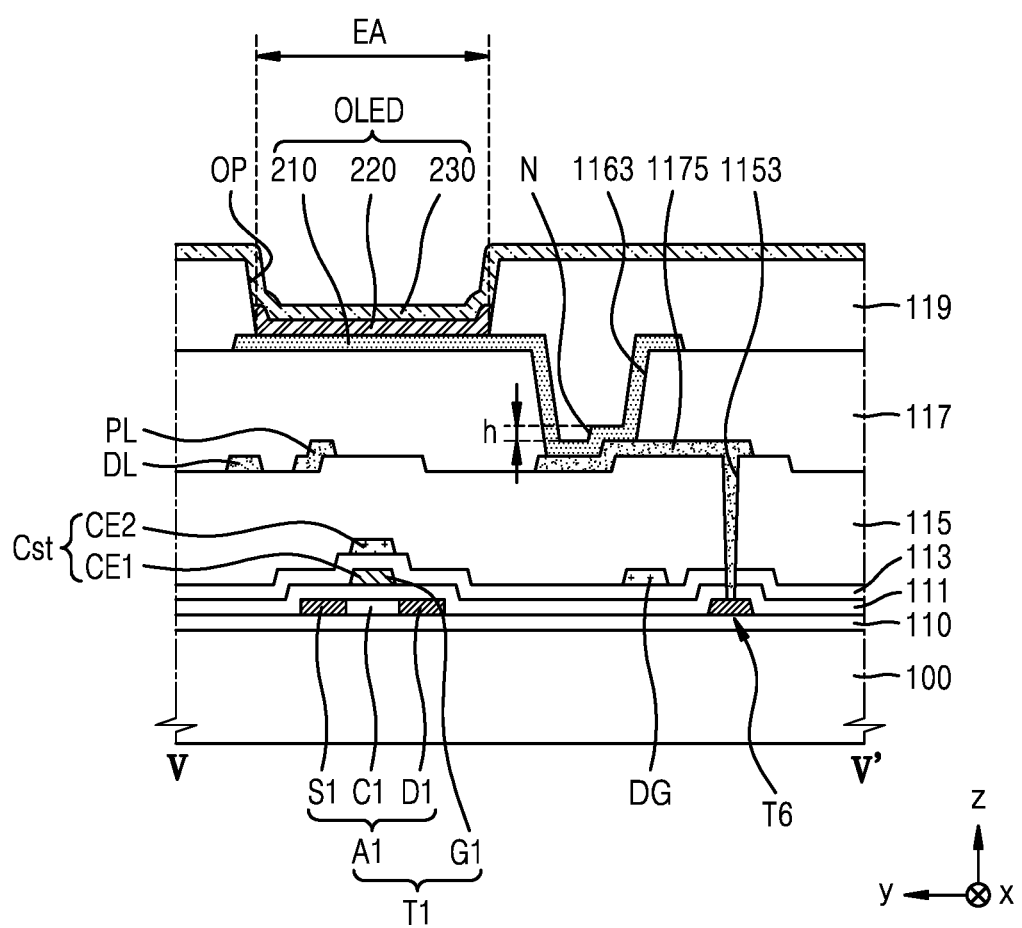
FIG. 10A is a schematic cross-sectional view of the display apparatus taken along line V-V of FIG. 9.
Figure 10B:
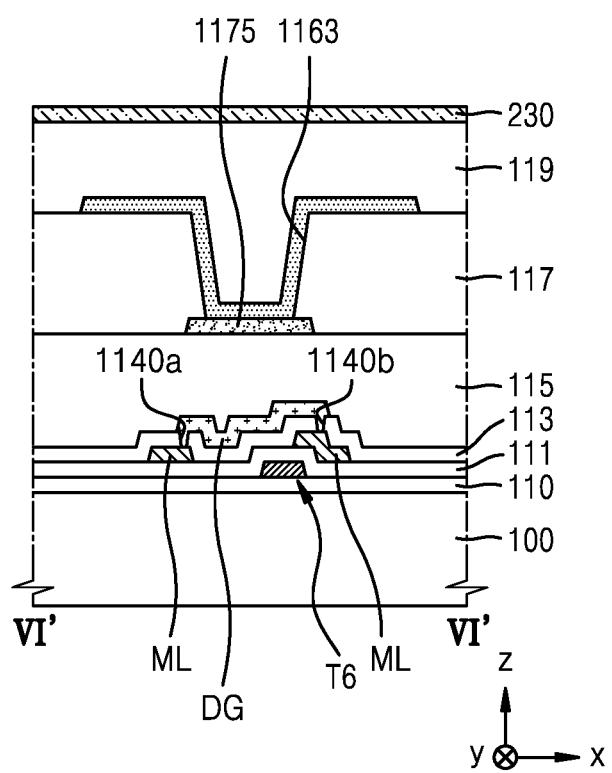
FIG. 10B is a schematic cross-sectional view of the display apparatus taken along line VI-VI' of FIG. 9.

FIG. 9 is a plan view of a pixel circuit of a display apparatus according to an exemplary embodiment of the present invention, FIG. 10A is a schematic cross-sectional view of the display apparatus taken along line V-V' of FIG. 9, and FIG. 10B is a schematic cross-sectional view of the display apparatus taken along line VI-VI' of FIG. 9. In FIGS. 9, 10A, 10B, and 10C, reference numerals that are the same as those in FIGS. 5, 6A, and 6B may refer to the same members or elements in FIGS. 5, 6A and 6B, and redundant descriptions thereof may be omitted.

In an exemplary embodiment of the present invention, the conductive line ML arranged between the substrate 100 and the step correction layer DG to extend in the third direction (for example, x-direction) may be disconnected at a portion overlapping the contact hole 1163. For example, the conductive line ML may include an opening or gap, and the contact hole 1163 may overlap the opening or gap in the conductive line ML.

Referring to FIGS. 9, 10A, and 10B, since the conductive line ML does not overlap a lower portion of the contact hole 1163 formed in the planarization layer 117 and partially exposing the electrode layer 1175, the conductive line ML does not exist in the lower portion of the contact hole 1163 and only the step correction layer DG may be arranged to partially overlap the lower portion of the contact hole 1163.

The conductive line ML disconnected at the portion overlapping the contact hole 1163 may be connected to the step correction layer DG through contact holes 1140a and 1140b formed in the second gate insulating layer 113. For example, the step correction layer DG may serve as a bridge connected to the disconnected conductive lines ML. In an exemplary embodiment of the present invention, the conductive line ML may be the emission control line EL configured to deliver the emission control signal En (see FIG. 4), and the emission control signal En may be delivered to the emission control TFT T6 through the contact holes 1410a and 1410b and the step correction layer DG while travelling along the disconnected conductive line ML.

As described in FIG. 6A, when the step correction layer DG partially overlapping the contact hole 1163 is included, the interlayer insulating layer 115 arranged on the step correction layer DG may be formed along the shape of the step correction layer DG, and the electrode layer 1175 arranged on the interlayer insulating layer 115 and connected to the emission control drain area D6 of the emission control TFT T6 may be also formed along the shape of the step correction layer DG.

The pixel electrode 210 may be in contact with the electrode layer 1175 through the contact hole 1163, and a portion of the pixel electrode 210 which is in contact with the electrode layer 1175 may be formed along the shape of the step correction layer DG. In other words, a top surface of the pixel electrode 210 overlapping the conductive line ML may be lower than a top surface of the pixel electrode 210 overlapping the step correction layer DG.

The pixel electrode 210 may extend in the +y-direction and the opening OP of the pixel defining layer 119 may be located on the +y-direction side with respect to the contact hole 1163, and the pixel electrode 210 may have the step h lowered in the +y-direction by the step correction layer DG.

In other words, the lower top surface among the top surfaces of the pixel electrode 210 which overlap the electrode layer 1175 exposed by the contact hole 1163 may be adjacent to the emission area EA, and the step h of the pixel electrode 210 may have the inclined surface N inclined toward the emission area EA.

According to an exemplary embodiment of the present invention, when the step correction layer DG arranged between the substrate 100 and the interlayer insulating layer 115 and partially overlapping the contact hole 1163 is included, a direction of the step h of the pixel electrode 210 in the contact hole 1163 may be adjusted through the step correction layer DG, and a direction in which the external light or the like is reflected by the pixel electrode 210 may be adjusted.

Figure 10C:
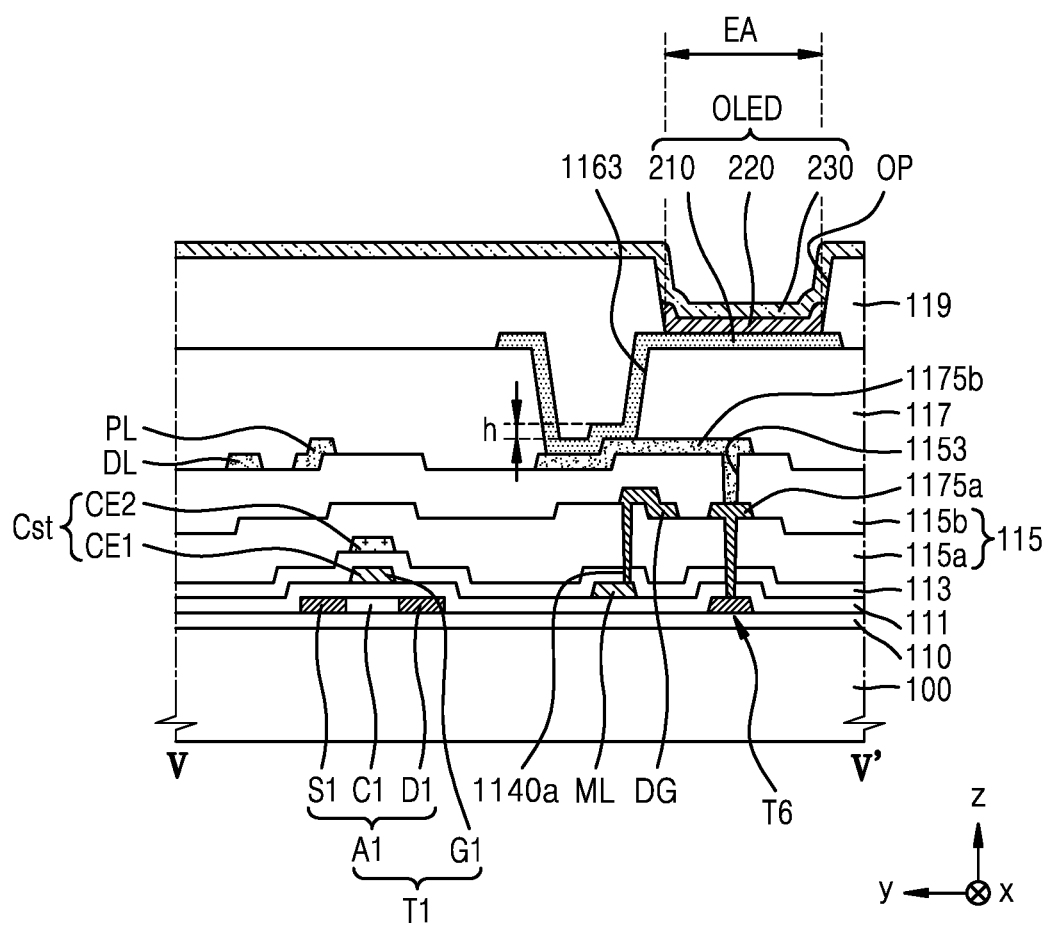
FIG. 10C is a schematic cross-sectional view of a display apparatus taken along line V-V of FIG. 9.

Although FIG. 10A illustrates that the interlayer insulating layer 115 is arranged between the electrode layer 1175 and the step correction layer DG, the interlayer insulating layer 115 may include the first interlayer insulating layer 115a and the second interlayer insulating layer 115b, and the step correction layer DG may be arranged on the first interlayer insulating layer 115a, as shown in FIG. 10C. The pixel electrode 210 may be in contact with a second electrode layer 1175b through the contact hole 1163, and the second electrode layer 1175b may be connected to the first electrode layer 1175a through the contact hole 1153 formed in the second interlayer insulating layer 115b. The step correction layer DG may be arranged on the same layer as the first electrode layer 1175a, and the step correction layer DG may include the same material as that of the first electrode layer 1175a.

Although FIG. 10C illustrates that the conductive line ML is arranged below the contact hole 1163, this is to show that the conductive line ML is connected to the step correction layer DG through the contact hole 1140a. As shown in FIG. 10A, the conductive line ML overlapping the contact hole 1163 is not arranged, and as shown in FIG. 10B, the conductive line ML, which is disconnected, is connected to the step correction layer DG through contact holes 1140a and 1140b.

Figure 11A:
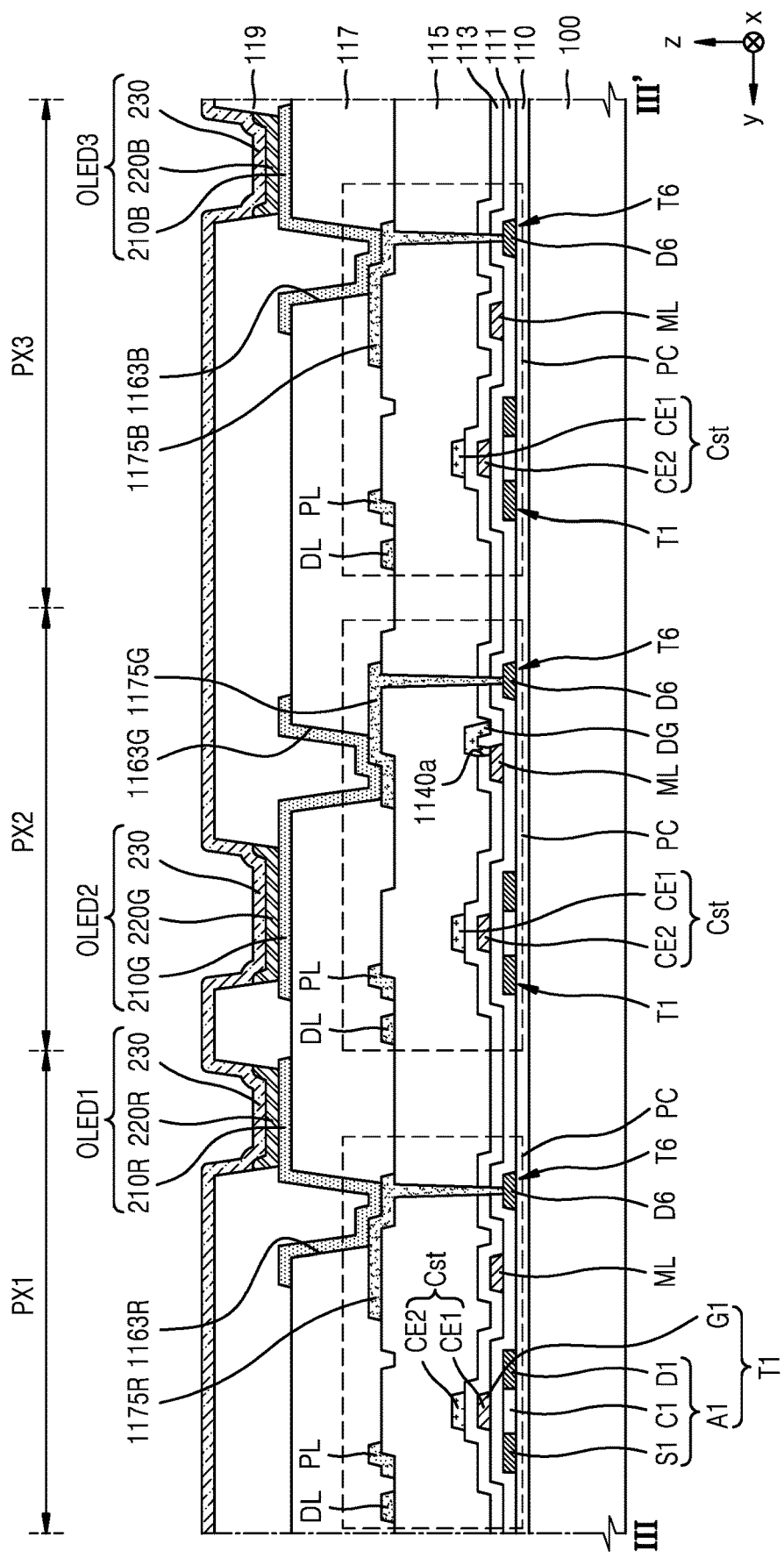
FIG. 11A is a schematic cross-sectional view of the display apparatus taken along line III-III' of FIG. 7A.
Figure 11B:
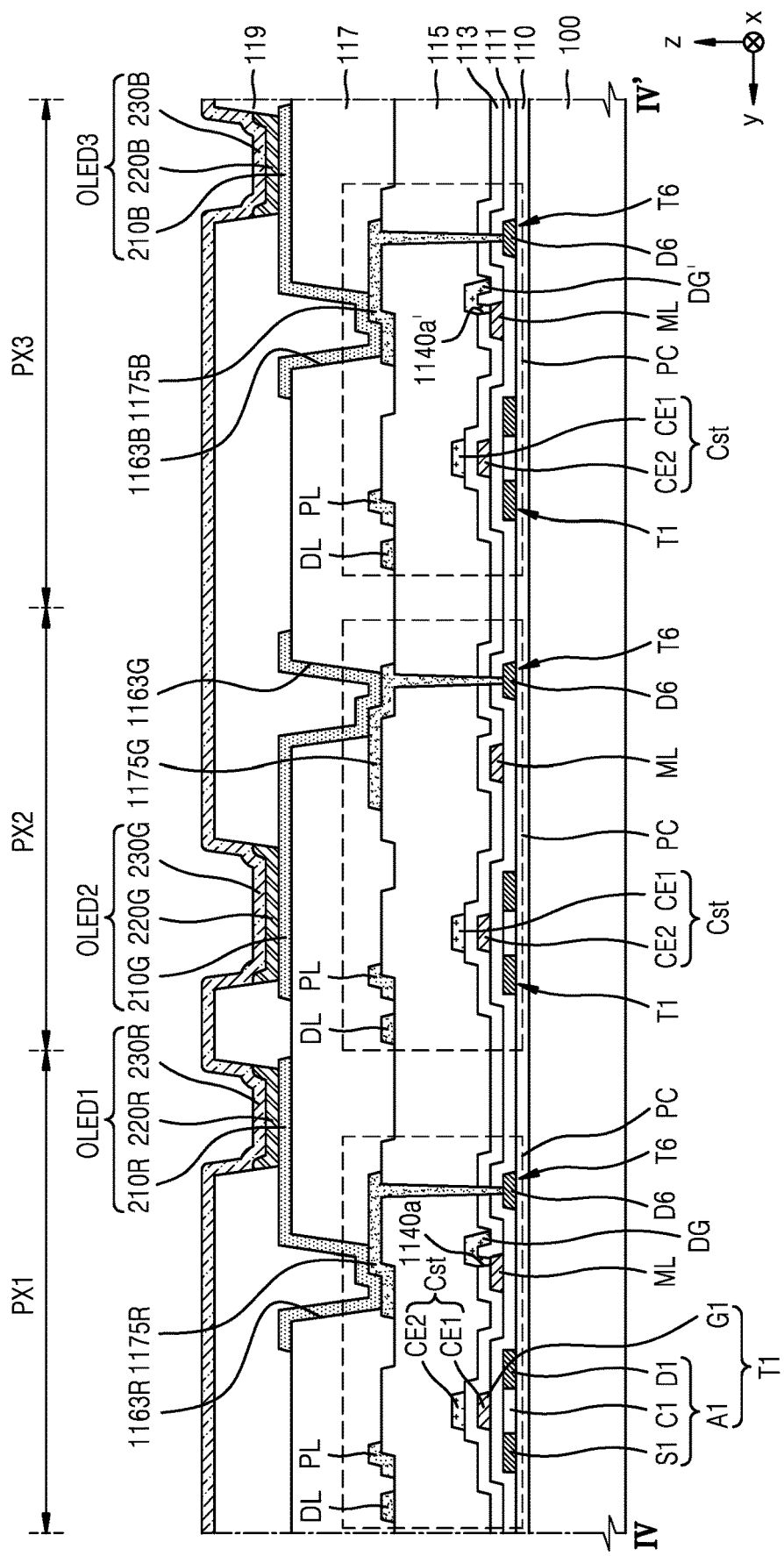
FIG. 11B is a schematic cross-sectional view of the display apparatus taken along line IV-IV' of FIG. 8A.

FIG. 11A is a schematic cross-sectional view of the display apparatus taken along line III-III' of FIG. 7A, and FIG. 11B is a schematic cross-sectional view of the display apparatus taken along line IV-IV' of FIG. 8A. In FIGS. 11A and 11B, reference numerals that are the same as those in FIGS. 7B and 8B refer to the same members or elements in FIGS. 7B and 8B, and redundant descriptions thereof may be omitted.

FIGS. 11A and 11B correspond to modified exemplary embodiments of FIGS. 7B and 8B, and will be described based on differences from FIGS. 7B and 8B.

Referring to FIG. 11A, in an exemplary embodiment of the present invention, the step correction layer DG may be arranged to partially overlap the second contact hole 1163G of the second pixel PX2. In this case, the pixel electrodes 210G of the second pixel PX2 extends in a direction different from that of the pixel electrodes 210R and 210B of the first and third pixels PX1 and PX3. The conductive line ML arranged between the substrate 100 and the step correction layer DG may be disconnected at a portion overlapping the second contact hole 1163G.

In FIGS. 9 and 10A, as described above, the conductive line ML, which is disconnected, may be connected to the step correction layer DG by the contact holes 1140a and 1140b, and may deliver the emission control signal En to the emission control TFT T6.

Referring to FIG. 11B, in an exemplary embodiment of the present invention, the step correction layers DG and DG' may be arranged to partially overlap the first and third contact holes 1163R and 1163B of the first and third pixels PX1 and PX3. In this case, the pixel electrodes 210R and 210B of the first and third pixels PX1 and PX3 extend in a direction different from that of the second pixel electrode 210G of the second pixel PX2. The conductive line ML arranged between the substrate 100 and the step correction layers DG and DG' may be disconnected at portions respectively overlapping the first and third contact holes 1163R and 1163B.

In the case of the first pixel PX1, the disconnected conductive line ML may be connected to a first step correction layer DG by the contact holes 1140a and 1140b (see FIG. 10B), and in the case of the third pixel PX3, the disconnected conductive line ML may be connected to a second step correction layer DG' through contact holes 1140a'. Accordingly, the conductive line ML may transfer the emission control signal En to the emission control TFT T6 without interruption.

Although FIGS. 11A and 11B illustrates that the conductive line ML is arranged below the first to third contact holes 1163R, 1163G, 1163B, this is to show that the conductive line ML is connected to the step correction layers DG and DG' through the contact holes 1140a and 1140a. As shown in FIG. 10A, the conductive line ML overlapping the contact hole 1163 may be omitted.

The display apparatus 1 according to an exemplary embodiment of the present invention may include the step correction layer DG arranged between the substrate 100 and the planarization layer 117, which is an insulating layer, and the step correction layer DG is partially overlapping the contact hole 1163 (See, e.g., FIG. 10A). Accordingly, since directions of the steps h of the pixel electrodes 210 located in the contact hole 1163 of the pixel PX may be formed to be the same, color separation may be improved. For example, the steps h of the pixel electrodes 210 may face their respective emission areas or may face away from their respective emission areas.

A display apparatus is described, but the present invention is not limited thereto. For example, a method of manufacturing the display apparatus is also included in the scope of the disclosure.

According to an exemplary embodiment of the present invention described above, a display apparatus, in which a phenomenon in which colors are separated by reflected light may be improved, may be implemented. The scope of the present invention is not limited to these effects.

While the present invention has been described with reference to exemplary embodiments thereof, it will be understood by those of ordinary skill in the art that various changes in form and details may be made thereto without departing from the spirit and scope of the present invention.

What is claimed is:

1. A display apparatus comprising:
   a first thin-film transistor and a second thin-film transistor each arranged on a substrate, wherein the first thin-film transistor comprises a first electrode layer, and the second thin-film transistor comprises a second electrode layer;
   an insulating layer having a first contact hole and a second contact hole respectively exposing a portion of the first electrode layer and a portion of the second electrode layer;
   a first pixel electrode arranged on the insulating layer and connected to the first thin-film transistor through the first contact hole; and
   a second pixel electrode arranged on the insulating layer and connected to the second thin-film transistor through the second contact hole,
   wherein a top surface of the first pixel electrode overlapping the first electrode layer in the first contact hole has a first step facing a first direction, and
   a top surface of the second pixel electrode overlapping the second electrode layer in the second contact hole has a second step facing a second direction opposite to the first direction.

2. The display apparatus of claim 1, further comprising a step correction layer arranged between the substrate and the insulating layer and at least partially overlapping the first contact hole.

3. The display apparatus of claim 2, further comprising a conductive line arranged between the substrate and the step correction layer, and extends in a third direction crossing the first direction and the second direction, and
   wherein the conductive line overlaps a portion of the first contact hole and a portion of the second contact hole.

4. The display apparatus of claim 3, wherein a top surface of a portion of the first pixel electrode overlapping the conductive line is lower than a top surface of a portion of the first pixel electrode overlapping the step correction layer.

5. The display apparatus of claim 3, wherein the conductive line overlaps the step correction layer.

6. The display apparatus of claim 3, wherein the conductive line is an emission control line.

7. The display apparatus of claim 3, wherein the conductive line is disconnected at the first contact hole.

8. The display apparatus of claim 7, further comprising a gate insulating layer arranged between the step correction layer and the conductive line, and having a third contact hole and a fourth contact hole each exposing a portion of the conductive line, and
   wherein the step correction layer is connected to the conductive line through the third contact hole and the fourth contact hole.

9. The display apparatus of claim 2, wherein the first pixel electrode extends in the first direction, and
   the second pixel electrode extends in the second direction.

10. The display apparatus of claim 9, further comprising a pixel defining film having a first opening and a second opening, wherein the first opening forms a first emission area of the first pixel electrode, and the second opening forms a second emission area of the second pixel electrode, and
    wherein the first opening is located on the first direction side with respect to the first contact hole, and the second opening is located on the second direction side with respect to the second contact hole.

11. The display apparatus of claim 10, wherein the first step has a first inclined surface facing the first direction, and the second step has a second inclined surface facing the second direction.

12. The display apparatus of claim 9, further comprising:
    a first intermediate layer and a second intermediate layer respectively arranged on the first pixel electrode and the second pixel electrode, and
    an opposite electrode covering the first intermediate layer and the second intermediate layer,
    wherein, when the first intermediate layer emits green light, the second intermediate layer emits red or blue light, and
    when the first intermediate layer emits red or blue light, the second intermediate layer emits green light.

13. The display apparatus of claim 2, wherein the first thin-film transistor comprises a semiconductor layer and a gate electrode overlapping the semiconductor layer,
    wherein the display apparatus further comprises an upper electrode of a storage capacitor arranged on the gate electrode and overlapping the gate electrode, and wherein the step correction layer is arranged on a same layer as the upper electrode.

14. The display apparatus of claim 13, wherein the first thin-film transistor overlaps the storage capacitor, and
the gate electrode corresponds to a lower electrode of the storage capacitor.

15. The display apparatus of claim 2, wherein the first thin-film transistor further comprises a third electrode layer arranged between the substrate and the first electrode layer, and
wherein the step correction layer is arranged on a same layer as the third electrode layer.

16. The display apparatus of claim 15, wherein the first thin-film transistor comprises a semiconductor layer and a gate electrode overlapping the semiconductor layer, and
the third electrode layer connects the semiconductor layer to the first electrode layer.

17. The display apparatus of claim 2, wherein the step correction layer is separated from the first thin-film transistor.

18. The display apparatus of claim 2, wherein the first pixel electrode extends in the second direction, and
the second pixel electrode extends in the first direction.

19. The display apparatus of claim 18, further comprising a pixel defining film having a first opening and a second opening, wherein the first opening forms a first emission area of the first pixel electrode, and the second opening forms a second emission area of the second pixel electrode,
wherein the first opening is located on the second direction side with respect to the first contact hole, the second opening is located on the first direction side with respect to the second contact hole, and
wherein the first step has a first inclined surface inclined toward the first direction, and the second step has a second inclined surface inclined toward the second direction.

20. The display apparatus of claim 18, further comprising:
a first intermediate layer and a second intermediate layer respectively arranged on the first pixel electrode and the second pixel electrode, and
an opposite electrode covering the first intermediate layer and the second intermediate layer,
wherein, when the first intermediate layer emits red or blue light, the second intermediate layer emits green light, and
when the first intermediate layer emits green light, the second intermediate layer emits red or blue light.

* * * * *